(12) United States Patent
Mochiki et al.

(10) Patent No.: US 10,855,269 B2
(45) Date of Patent: Dec. 1, 2020

(54) DRIVE CIRCUIT

(71) Applicant: DENSO CORPORATION, Kariya, Aichi-pref. (JP)

(72) Inventors: Kengo Mochiki, Kariya (JP); Mitsunori Kimura, Kariya (JP); Yoshinori Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/351,945

(22) Filed: Mar. 13, 2019

(65) Prior Publication Data

US 2019/0288678 A1    Sep. 19, 2019

(30) Foreign Application Priority Data

Mar. 13, 2018  (JP) .................. 2018-045667

(51) Int. Cl.
| | | |
|---|---|---|
| *H03K 17/082* | (2006.01) | |
| *H02P 27/06* | (2006.01) | |
| *H02M 7/5387* | (2007.01) | |
| *H02M 1/08* | (2006.01) | |

(52) U.S. Cl.
CPC .......... *H03K 17/0822* (2013.01); *H02M 1/08* (2013.01); *H02M 7/53871* (2013.01); *H02P 27/06* (2013.01)

(58) Field of Classification Search
CPC ............ H02M 1/00; H02M 1/08; H02M 1/32; H02M 7/00; H02M 7/5387; H02M 7/53871; H02P 27/00; H02P 27/06; H03K 17/00; H03K 17/04126; H03K 17/063; H03K 17/082; H03K 17/0822; H03K 17/0826; H03K 17/601; H03K 2217/0036
USPC .......................................... 327/109
See application file for complete search history.

(56) References Cited

U.S. PATENT DOCUMENTS

| | | | | |
|---|---|---|---|---|
| 2015/0084551 | A1* | 3/2015 | Hayashi ................. | H02P 27/06 318/8 |
| 2017/0033790 | A1* | 2/2017 | Osanai ................. | H03K 17/567 |
| 2018/0034388 | A1* | 2/2018 | Kawai ................. | H03K 5/1536 |

FOREIGN PATENT DOCUMENTS

JP    2015-103955 A    6/2015

* cited by examiner

*Primary Examiner* — Lincoln D Donovan
*Assistant Examiner* — Dave Mattison
(74) *Attorney, Agent, or Firm* — Oliff PLC

(57) ABSTRACT

In a drive circuit, one of an upper-arm switch and a lower-arm switch being in an on state by a main driver is referred to as a target arm switch. The other of the upper-arm switch and the lower-arm switch being in an off state by the main driver is referred to as an opposite arm switch. An intrinsic diode connected in antiparallel to the opposite arm switch is referred to as an opposite arm diode. The drive circuit includes a protective driver configured to determine whether a failure has occurred in the target arm switch. The protective driver is configured to change the target arm switch from the on state to the off state, and the opposite arm switch from the off state to the on state upon determining that a failure has occurred in the target arm switch.

16 Claims, 19 Drawing Sheets

FIG.5C IdsL

FIG.5D IdsH

FIG.5E AMOUNT OF HEAT GENERATED FROM UPPER-ARM SWITCH

COMPARATIVE EXAMPLE

FIRST EMBODIMENT

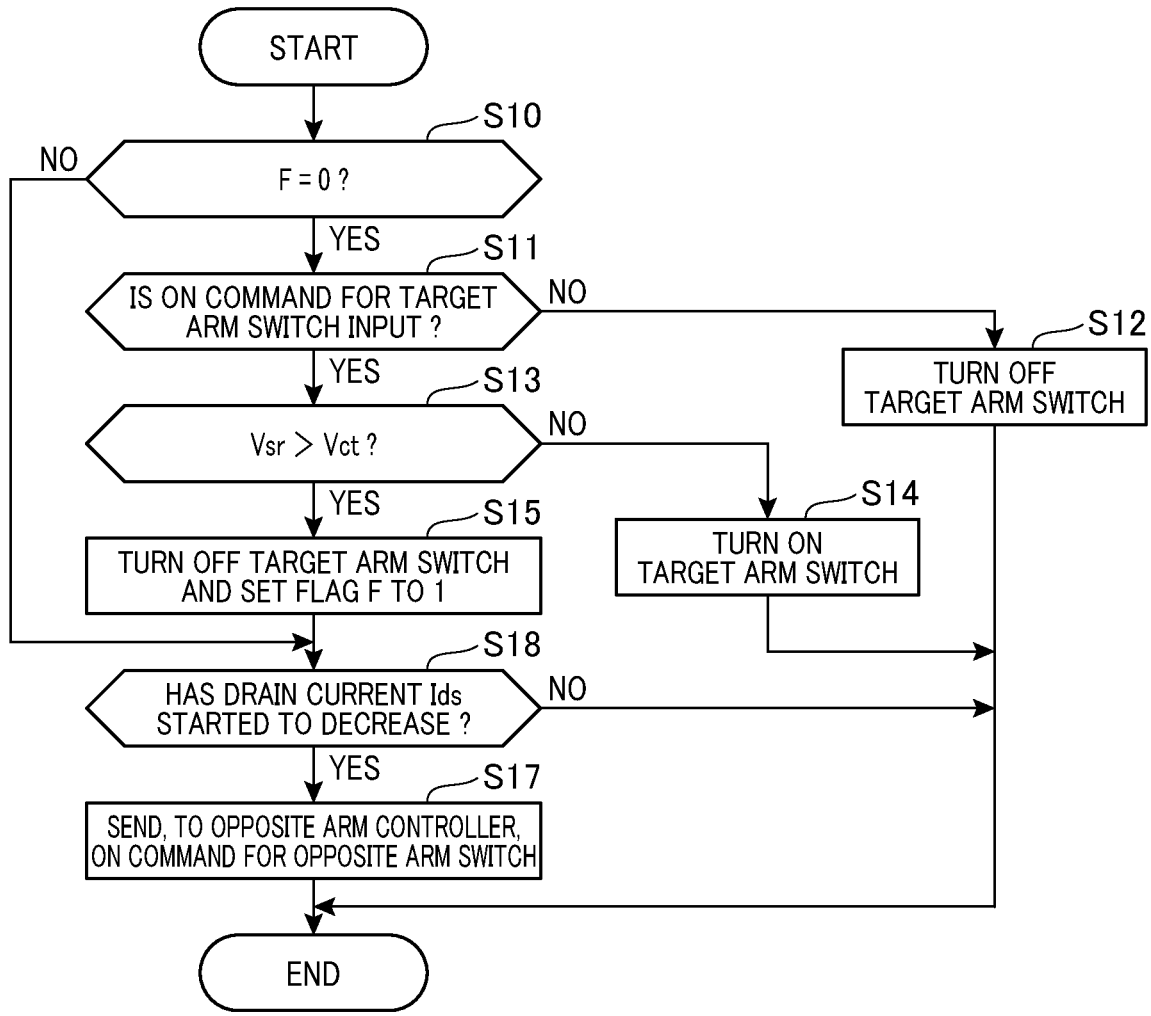

DRIVE CIRCUIT

CROSS REFERENCE TO RELATED APPLICATION

This application is based on and claims the benefit of priority from Japanese Patent Application No. 2018-45667 filed on Mach 13, 2018, the disclosure of which is incorporated in its entirety herein by reference.

TECHNICAL FIELD

The present disclosure relates to drive circuits for series-connected upper- and lower-arm switches.

BACKGROUND

One of conventional drive circuits is configured to drive upper- and lower-arm switches connected in series to each other.

SUMMARY

An exemplary aspect of the present disclosure provides a drive circuit. In the drive circuit, one of an upper-arm switch and a lower-arm switch being in an on state by a main driver is referred to as a target arm switch. The other of the upper-arm switch and the lower-arm switch being in an off state by the main driver is referred to as an opposite arm switch. An intrinsic diode connected in antiparallel to the opposite arm switch is referred to as an opposite arm diode.

A protective driver is configured to determine whether a failure has occurred in the target arm switch, and change the target arm switch from the on state to the off state, and the opposite arm switch from the off state to the on state upon determining that a failure has occurred in the target arm switch.

BRIEF DESCRIPTION OF THE DRAWINGS

Other aspects of the present disclosure will become apparent from the following description of embodiments with reference to the accompanying drawings in which:

FIGS. 5A to 5E are a joint timing chart schematically illustrating how electrical parameters of the target and opposite arm circuits are changed over time according to the first embodiment;

FIG. 6 is a flowchart schematically illustrating a target-arm switch driving routine according to the second embodiment of the present disclosure;

FIGS. 7A to 7C are a joint timing chart schematically illustrating how electrical parameters of the target and opposite arm circuits are changed over time according to the second embodiment;

DETAILED DESCRIPTION OF EMBODIMENT

Inventor's Viewpoint

Figure 1:
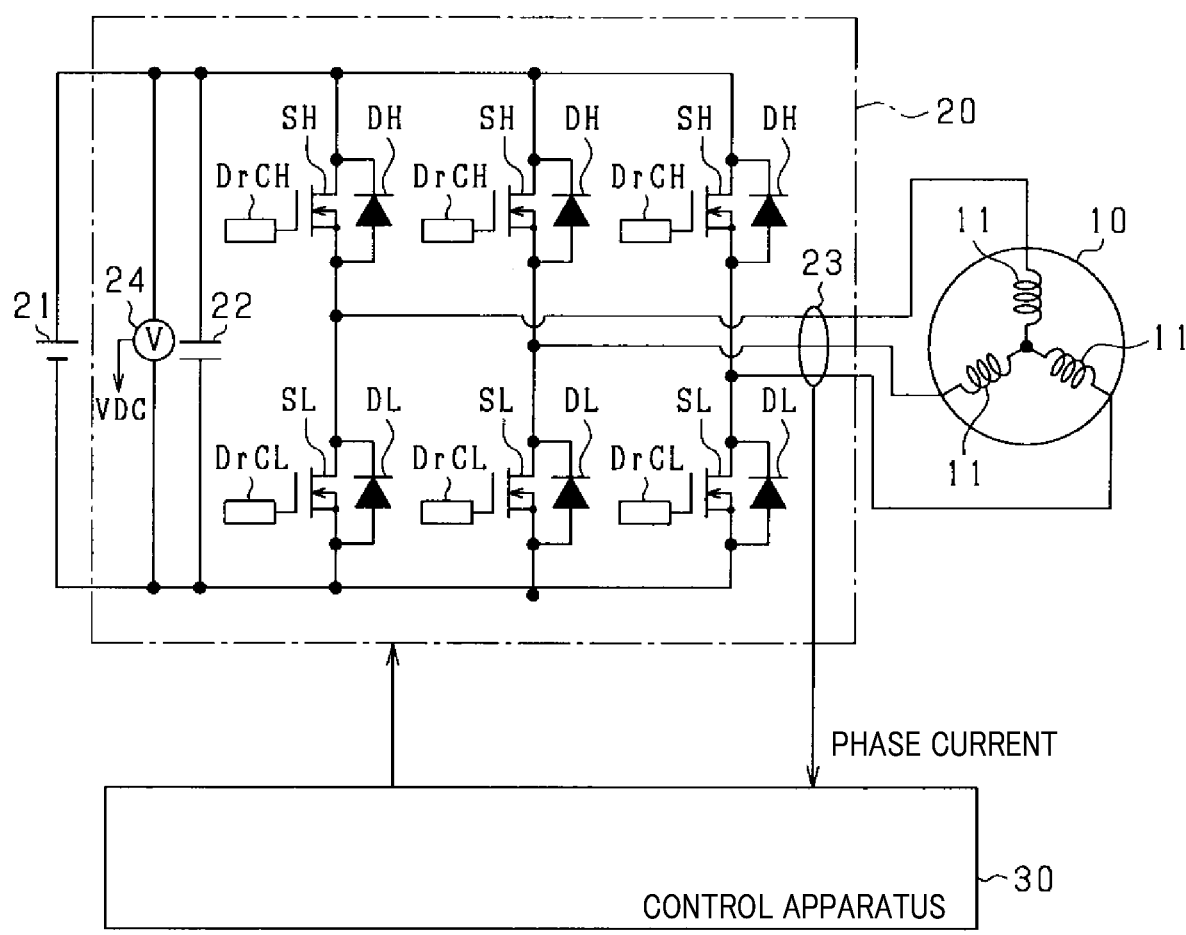
FIG. 1 is a circuit diagram schematically illustrating an example of the overall structure of a control system for a rotary electric machine according to the first embodiment of the present disclosure.

A drive circuit is configured to alternately turn on the upper- and lower-arm switches. The drive circuit is specially configured to turn off each of the upper- and lower-arm switches upon determining that a failure, such as an over-current failure, has occurred in the on-state switch, making it possible to protect the upper- and lower-arm switches.

A switch with an intrinsic diode, such as an N-channel MOSFET, can be used for each of the upper- and lower-arm switches. Upon determining that a failure has occurred in one of the upper- and lower-arm switches, the drive circuit turns off the upper- and lower-arm switches, each of which has an intrinsic diode. This may cause a flyback current to flow through the intrinsic diode of the other of the upper- and lower-arm switches.

The amount of heat generated based on the overcurrent flowing through the intrinsic diode may be higher than the amount of heat generated based on the overcurrent flowing through one of the upper- and lower-arm switches. This may result in a reduction in the reliability of the other of the upper- and lower-arm switches although the upper- and lower-arm switches are turned off for protecting these switches.

From this viewpoint, one aspect of the present disclosure seeks to provide drive circuits for series-connected upper- and lower-arm switches, each of which is capable of preventing, even if a failure has occurred in one of the upper- and lower-arm switches, a reduction in the reliability of the other of the upper- and lower-arm switches.

EMBODIMENT

From the above viewpoint, the following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment of the present disclosure with reference to FIGS. 1 to 5. A drive circuit according to the first embodiment is embodied as a component of a control system CS for controlling a rotary electric machine 10.

Referring to FIG. 1, the control system CS includes a direct-current (DC) power source 21, an inverter 20, upper-arm drive circuits DrCH, lower-arm drive circuits DrCL, and a control apparatus 30. The assembly of the upper-arm drive circuits DrCH and the lower-arm drive circuits DrCL corresponds to, for example, a drive circuit.

The rotary electric machine 10 is electrically connected to the DC power source 21 via the inverter 20. The first embodiment uses a permanent magnet synchronous three-phase motor-generator as the rotary electric machine 10.

In particular, the rotary electric machine 10 includes a rotor having permanent magnets, and a stator having a stator core and three-phase stator coils 11. In particular, the rotary electric machine 10 is capable of rotating the rotor having the permanent magnets based on magnetic interactions between the permanent magnets of the rotor and a rotating magnetic field generated by the three-phase stator coils 11. Each of the three-phase stator coils 11 has opposing first and second ends. The stator can be configured such that each of the three-phase stator coils 11 is wound in and around the stator core in concentrated or distributed configuration.

The control system CS also includes a smoothing capacitor 22 connected in parallel to the DC power source 21.

The DC power source 21 is configured as, for example, a secondary battery, i.e. a DC-power rechargeable battery, has a terminal voltage, and the smoothing capacitor 22 is configured to smooth the terminal voltage of the DC power source 21, so that the smoothed voltage is input to the inverter 20 as a power supply voltage or an inverter input voltage VDC.

The inverter 20 includes three (UVW)-phase series-connected switch members for the respective three-phase of the rotary electric machine 10. The series-connected switch member for each phase is comprised of an upper-arm switch SH and a lower-arm switch SL connected in series to each other.

The first embodiment uses, as each of the upper- and lower-arm switches SH and SL, an N-channel MOSFET, which is a unipolar, wide-bandgap semiconductor switch, such as a silicon carbide (SiC) switch or a Gallium nitride (GaN) switch. Each of the upper-arm switches SH incorporates, as its intrinsic diode, an upper-arm diode DH connected in antiparallel thereto. Similarly, each of the lower-arm switches SL incorporates, as its intrinsic diode, a lower-arm diode DL connected in antiparallel thereto.

Note that the drain of each of the upper- and lower-arm switches SH and SL serves as a high-side terminal, and the source thereof serves as a low-side terminal. Each of the each of the upper- and lower-arm switches SH and SL being in an on state enables a current to flow therethrough between the drain and the source thereof. In contrast, each of the each of the upper- and lower-arm switches SH and SL being in an off state disables a current from flowing from the drain to the source. Each of the each of the upper- and lower-arm switches SH and SL being in the off state enables a current to flow from the source to the drain via the corresponding one of the upper- and lower-arm diodes DH and DL.

The connection point between the upper- and lower-arm switches SH and SL for each phase is connected to the first end of the corresponding one of the three-phase stator coils 11. The second ends of the three-phase coils 11 are connected to a common junction, i.e. a neutral point, in, for example, a star-configuration such that three-phase coils 11 have a phase difference of 120 electrical degrees from each other.

The control system CS also includes a phase current sensor 23 and a voltage sensor 24. The phase current sensor 23 is arranged to measure at least two-phase currents in the three-phase currents flowing through the respective three-phase coils 11. The voltage sensor 24 is arranged to measure a voltage across the smoothing capacitor 22 as a power supply voltage VDC. The measured at least two-phase currents and the measured power supply voltage VDC are input to the control apparatus 30.

The upper-arm drive circuits DrCH are provided for the respective upper-arm switches SH and connected to the control terminals, such as the gates, of the respective upper-arm switches SH. Similarly, the lower-arm drive circuits DrCL are provided for the respective lower-arm switches SL and connected to the control terminals, such as the gates, of the respective lower-arm switches SL.

The control apparatus 30 is controllably connected to the upper-drive and lower-arm circuits DrCH and DrCL The control apparatus 30 is configured to control on-off switching operations of each of the upper-arm switches SH via the corresponding one of the upper-arm drive circuits DrCH, and on-off switching operation of each of the lower-arm switches SL via the corresponding one of the lower-arm drive circuits DrCL to thereby control a controlled variable, such as torque, of the rotary electric machine 10 to a commanded value or a requested value.

Specifically, the control apparatus 30 outputs upper-arm drive signals to the respective upper-arm drive circuits DrCH and lower-arm drive signals to the respective lower-arm drive circuits DrCL to cause the upper- and lower-arm drive circuits DrCH and DrCL of each phase to alternately turn on the upper- and lower-arm switches SH and SL of the corresponding phase while ensuring deadtimes between (1) Turn-off timing of the upper-arm switch SH and turn-on timing of the lower-arm switch SL (2) Turn-on timing of the upper-arm switch SH and turn-off timing of the lower-arm switch SL The drive signals include an on command for instructing a corresponding switch to be switched from the off state to the on state, and an off command for instructing a corresponding switch to be switched from the on state to the off state.

Figure 2:
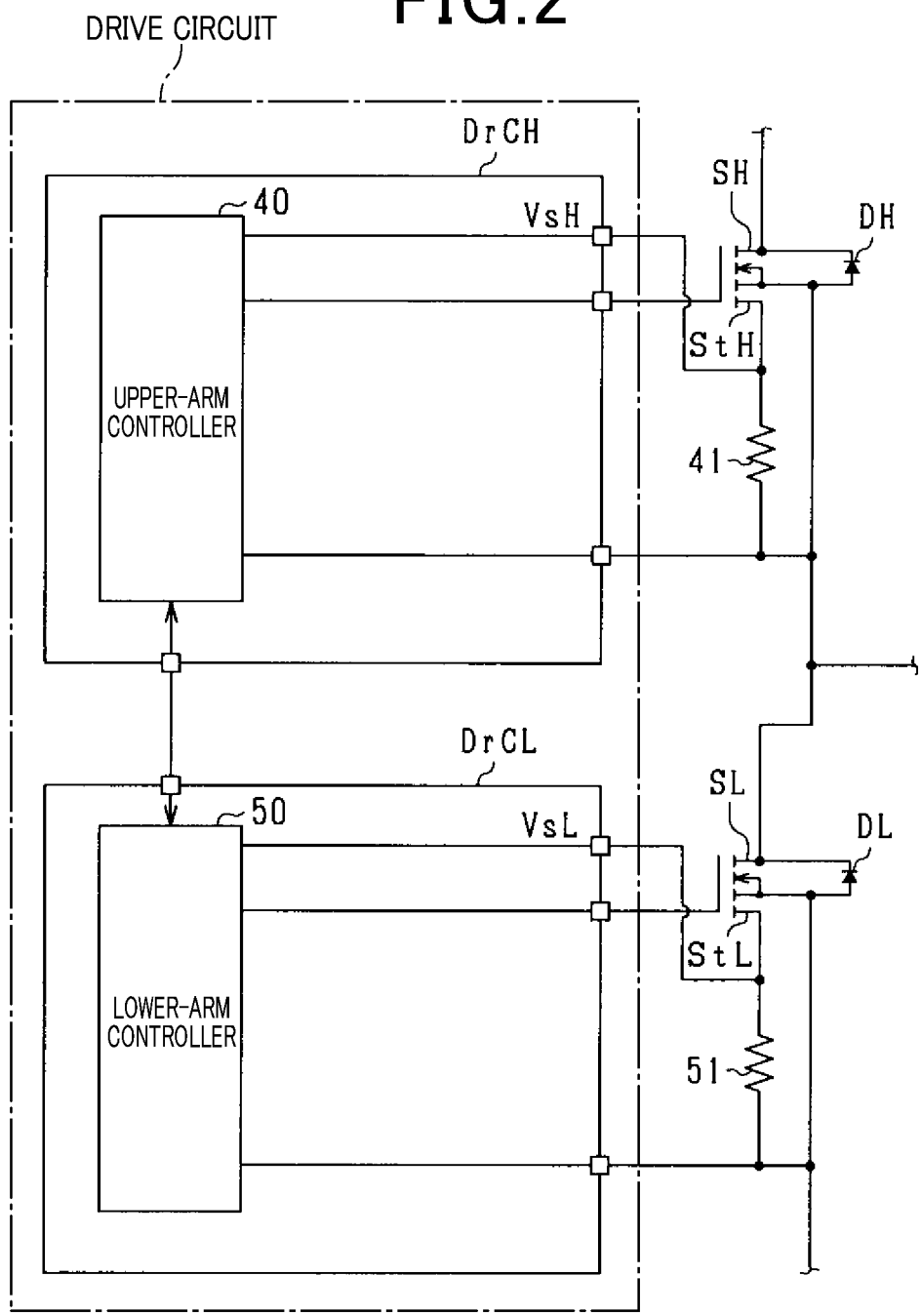
FIG. 2 is a circuit diagram schematically illustrating an example of the structure of each of an upper-arm drive circuit and a lower-arm drive circuit illustrated in FIG. 1.

Next, the following describes each of the upper- and lower drive circuits DrCH and DrCL with reference to FIG. 2.

First, the following describes the upper-arm drive circuits DrCH.

Each upper-arm drive circuit DrCH includes an upper arm controller 40. The upper arm controller 40 is connected to the control apparatus 30, and receives the upper-arm drive signal sent from the control apparatus 30.

The upper arm controller 40 determines whether the upper-arm drive signal is the on-command, and performs a charging task upon determining that the upper-arm drive signal is the on-command.

The charging task is configured to apply, to the gate of the upper-arm switch SH, a voltage higher than a predetermined threshold voltage Vth to thereby supply a charging current to the gate of the upper-arm switch SH. The charging task causes a control voltage at the gate of the upper-arm switch SH, which is a gate voltage Vgs, to be higher than the threshold voltage Vth, resulting in the upper-arm switch SH being switched from the off state to the on state.

The threshold voltage Vth of a switch is defined as a voltage that enables the switch to be changed from one of the on state and the off state to the other thereof.

The upper arm controller 40 also performs a discharging task upon determining that the upper-arm drive signal is the off-command.

The discharging task is configured to connect the gate of the upper-arm switch SH to a common signal ground to thereby discharge a discharging current from the gate of the upper-arm switch SH to the common signal ground. The discharging task causes the gate voltage Vgs to be lower than the threshold voltage Vth, resulting in the upper-arm switch SH being switched from the on state to the off state.

Each upper-arm switch SH has an upper-arm sense terminal StH for outputting a minute current, i.e. a sense current, associated with (1) A drain current flowing through a conductive path between the source and drain of the corresponding upper-arm switch SH (2) A flyback current flowing through the upper-arm diode DH The sense terminal StH is connected to a first end of an upper-arm sense resistor 41, and a second end, opposing the first end, of the upper-arm sense resistor 41 is connected to the source of the corresponding upper-arm switch SH via the common signal ground.

When the sense current flows through the upper-arm sense resistor 41, a voltage drop across the upper-arm sense resistor 41 occurs. Thus, a voltage at the first end of the upper-arm sense resistor 41, which will be referred to as an upper-arm sense voltage VsH, relative to the source potential serves as, for example, an electric state parameter correlating with the magnitude of the drain current or the flyback current. The potential at the source of the upper-arm switch SH is set to zero, and, when the potential at the first end of the upper-arm sense resistor 41 is higher than the source potential, the upper-arm sense voltage VsH is defined to have a positive potential. The first end of the upper-arm sense resistor 41 is connected to the upper arm controller 40 via a terminal of the upper-arm drive circuit DrCH, so that the upper-arm sense voltage VsH is sent to the upper arm controller 40.

Next, the following describes the lower-arm drive circuits DrCL.

Each lower-arm drive circuit DrCL includes a lower arm controller 50. The lower arm controller 50 is connected to the control apparatus 30, and receives the lower-arm drive signal sent from the control apparatus 30.

The upper- and lower arm controllers 40 and 50 are communicably connected to each other.

The lower arm controller 50 determines whether the lower-arm drive signal is the on-command, and performs (1) The charging task of the lower-arm switch SL upon determining that the lower-arm drive signal is the on-command (2) The discharging task of the lower-arm switch SL upon determining that the lower-arm drive signal is the off-command Because each of the charging task and discharging task of the lower-arm drive circuit DrCL is substantially identical to the corresponding one of the charging task and discharging task of the upper-arm drive circuit DrCH, the description of each of the charging task and discharging task of the lower-arm drive circuit DrCL will be omitted.

Each lower-arm switch SL has a lower-arm sense terminal StL for outputting a minute current, i.e. a sense current, associated with (1) A drain current flowing through a conductive path between the source and drain of the corresponding lower-arm switch SL (2) A flyback current flowing through the lower-arm diode DL The sense terminal St is connected to a first end of a lower-arm sense resistor 51, and a second end, opposing the first end, of the lower-arm sense resistor 51 is connected to the source of the corresponding lower-arm switch SL via a common signal ground.

When the sense current flows through the lower-arm sense resistor 51, a voltage drop across the lower-arm sense resistor 51 occurs. Thus, a voltage at the first end of the lower-arm sense resistor 51, which will be referred to as a lower-arm sense voltage VsL, relative to the source potential serves as, for example, an electric state parameter correlating with the magnitude of the drain current or the flyback current. The potential at the source of the lower-arm switch SL is set to zero, and, when the potential at the first end of the lower-arm sense resistor 51 is higher than the source potential, the lower-arm sense voltage VsL is defined to have a positive potential. The first end of the lower-arm sense resistor 51 is connected to the lower arm controller 50 via a terminal of the lower-arm switch DrCL, so that the lower-arm sense voltage VsL is sent to the lower arm controller 50.

Each of the upper- and lower arm controllers 40 and 50 provides various functions. At least part of all the functions provided by each of the upper- and lower arm controllers 40 and 50 can be implemented by at least one processor; the at least one processor can be comprised of (1) The combination of at least one programmable processing unit, i.e. at least one programmable logic circuit, and at least one memory (2) At least one hardwired logic circuit (3) At least one hardwired-logic and programmable-logic hybrid circuit For example, each of the upper- and lower arm controllers 40 and 50 can be configured such that the at least one processor performs instructions of programs stored in a memory, thus implementing the functions.

In the first embodiment, one of the upper- and lower-arm switches SH and SL, which is in the on state based on the charging task in response to the on command sent from the control apparatus 30, will be referred to as a target arm switch. Additionally, the other of the upper- and lower-arm switches SH and SL, which is in the off state based on the discharging task in response to the off command sent from the control apparatus 30, will be referred to as an opposite arm switch. Moreover, one of the upper- and lower-arm diodes DH and DL, which is incorporated in the target arm switch will be referred to as a target arm diode, and the other of the upper- and lower-arm diodes DH and DL, which is incorporated in the opposite arm switch, will be referred to as an opposite arm diode.

One of the upper- and lower arm controllers 40 and 50, which drives the target arm switch, will be referred to as a target arm controller, and the other of the upper- and lower arm controllers 40 and 50, which drives the opposite arm switch, will be referred to as an opposite arm controller.

One of the upper- and lower-arm sense voltages VsH and VsL, which is obtained by the target arm controller, will be referred to as a target arm voltage Vsr, and the other of the upper- and lower-arm sense voltages VsH and VsL, which is obtained by the opposite arm controller, will be referred to as an opposite arm voltage.

Note that the upper- and lower arm controllers 40 and 50 of the first embodiment cooperatively serve as a main driver and a protective driver.

Figure 3:
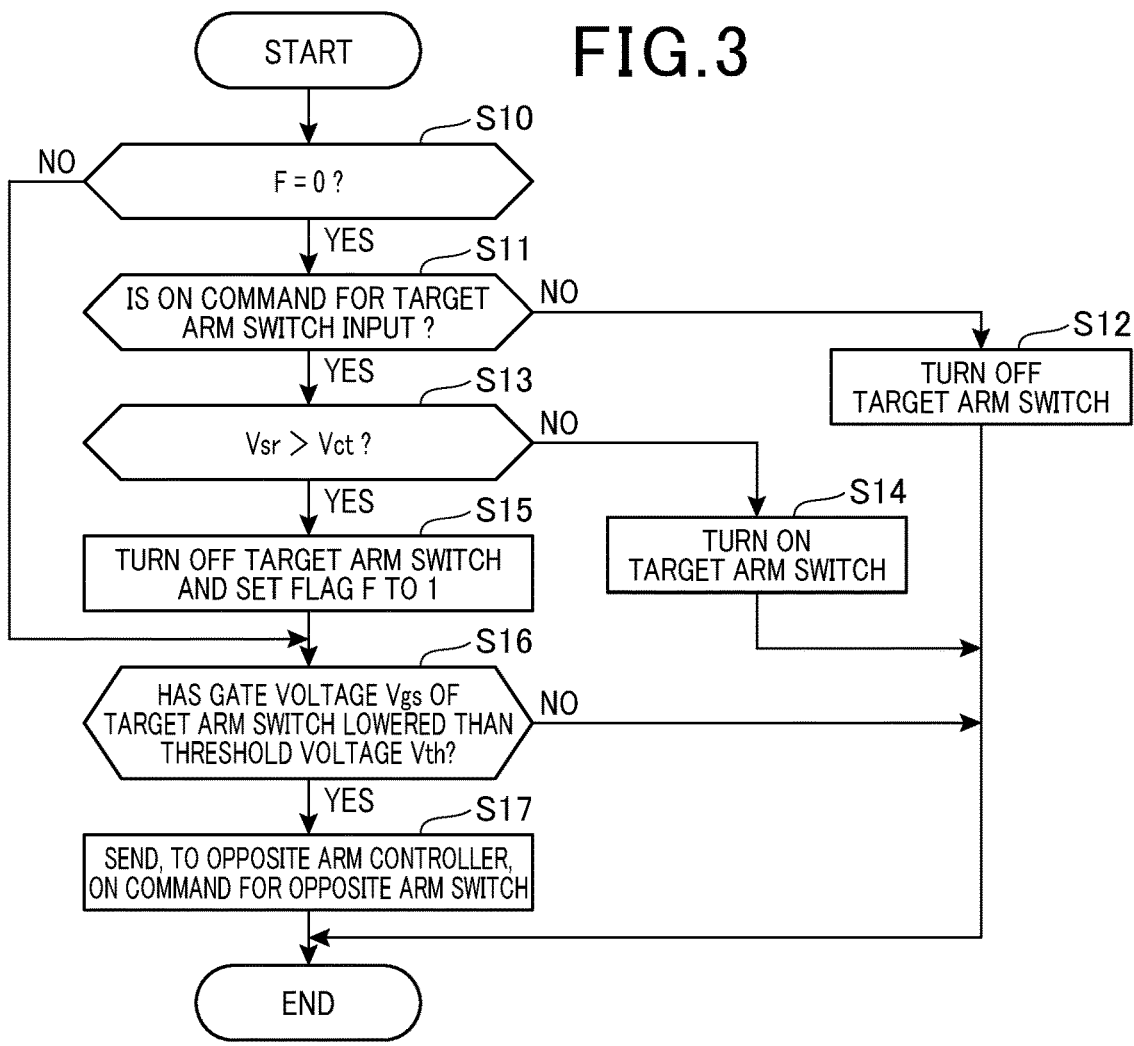
FIG. 3 is a flowchart schematically illustrating a target-arm switch driving routine according to the first embodiment.

The following describes a target-arm switch driving routine carried out by the target arm controller with reference to FIG. 3. The target arm controller is configured to perform the target-arm switch driving routine every predetermined control period.

When starting the target-arm switch driving routine, the target arm controller determines whether a failure determination flag F is set to 0 in step S10. Note that the failure determination flag F is previously prepared in each of the controllers 40 and 50, and the failure determination flag being set to 0 represents no failures having occurred in the target arm switch, and the failure determination flag being set to 1 represents a failure having occurred in the target arm switch. The failure determination flag F is set to an initial value of 0.

Upon determining that the failure determination flag F is set to 0 (YES in step S10), the target arm controller determines whether the on command for the target arm switch has been input thereto in step S11. Upon determining that the on command for the target arm switch has not been input thereto (NO in step S11), the target arm controller serves as, for example, the main driver to determine that the off command has been input thereto, and performs the discharging task for the target arm switch to thereby turn off the target arm switch in step S12.

Otherwise, upon determining that the on command for the target arm switch has been input thereto (YES in step S11), the target arm controller determines whether the target arm voltage Vsr has exceeded an overcurrent threshold Vct in step S13. Note that the overcurrent threshold Vct is previously determined such that, when the target arm voltage Vsr has exceeded an overcurrent threshold Vct, an overcurrent failure is likely to have occurred in the target arm switch. That is, the operation in step S13 is to determine whether an overcurrent failure has occurred in the target arm switch.

Upon determining that the target arm voltage Vsr has not exceeded the overcurrent threshold Vct (NO in step S13), the target arm controller serves as, for example, the main driver to perform the charging task for the target arm switch to thereby turn on the target arm switch in step S14.

Otherwise, upon determining that the target arm voltage Vsr has exceeded the overcurrent threshold Vct (YES in step S13), the target arm controller sets the failure determination flag F to 1 in step S15. In step S15, the target arm controller serves as, for example, the protective driver to forcibly perform the discharging task for the target arm switch to thereby turn off the target arm switch independently of the on command being inputted thereto.

After completion of the operation in step S15 or when the negative determination in step S10 is performed, the target-arm switch driving routine proceeds to step S16.

In step S16, the target arm controller serves as, for example, the protective driver to determine whether the gate voltage Vgs of the target arm switch has lowered below the threshold voltage Vth while the failure determination flag F being set to 1. When it is determined that the gate voltage Vgs of the target arm switch has lowered below the threshold voltage Vth while the failure determination flag F being set to 1 (YES in step S16), the target-arm switch driving routine proceeds to step S17. In step S17, the target arm controller serves as, for example, the protective driver to send, to the opposite arm controller, the on command for switching the opposite arm switch from the off state to the on state, and thereafter, terminates the target-arm switch driving routine. Note that the threshold voltage Vth to be compared with the gate voltage Vgs in step S16 corresponds to, for example, a determination voltage.

After the operation in step S12 or step S14, the target arm controller terminates the target-arm switch driving routine.

Note that the target arm controller is configured to set the failure determination flag to 0 upon a predetermined condition being satisfied; the predetermined condition is, for example, a condition that the state where the target arm voltage Vsr is equal to or lower than the overcurrent threshold Vct has elapsed for a predetermined period.

Figure 4:
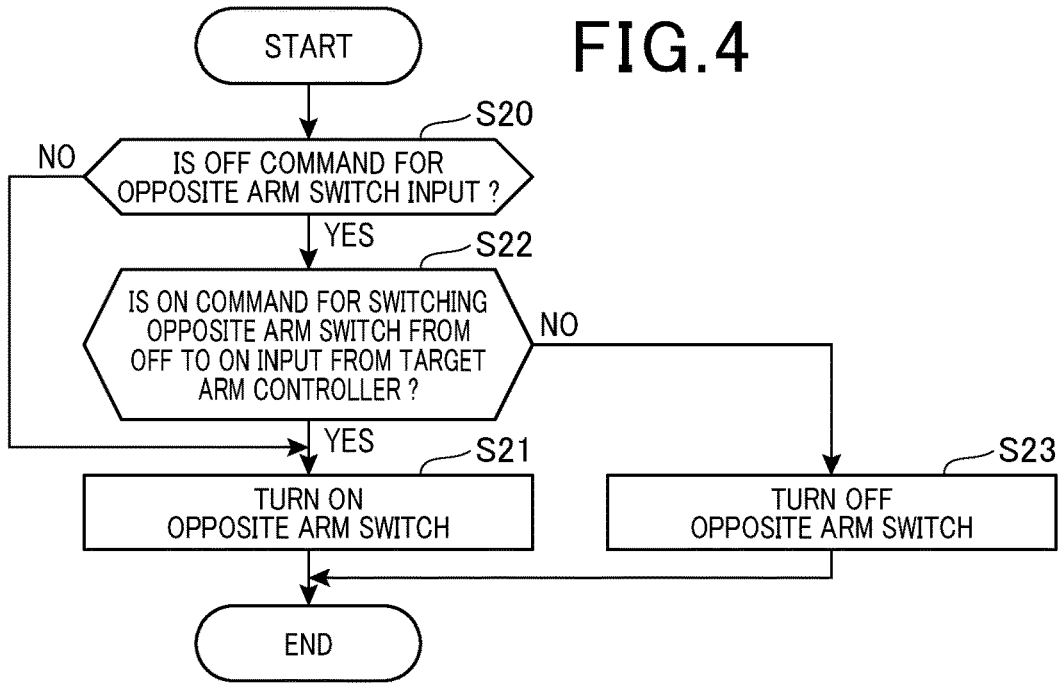
FIG. 4 is a flowchart schematically illustrating an opposite-arm switch driving routine according to the first embodiment.

The following describes an opposite-arm switch driving routine carried out by the opposite arm controller with reference to FIG. 4. The opposite arm controller is configured to perform the opposite-arm switch driving routine every predetermined control period.

When starting the opposite-arm switch driving routine, the opposite arm controller deter mines whether the off command for the opposite arm switch has been input thereto in step S20. Upon determining that the off command for the opposite arm switch is not input thereto (NO in step S20), the opposite arm controller determines that the on command has been input thereto, and performs the charging task for the opposite arm switch to thereby turn on the opposite arm switch in step S21.

Otherwise, upon determining that the off command for the opposite arm switch has been input thereto (YES in step S20), the opposite arm controller serves as, for example, the protective driver to determine whether the on command for switching the opposite arm switch from the off state to the on state has been input thereto from the target arm controller in step S22. Upon determining that the on command for switching the opposite arm switch from the off state to the on state is not input thereto from the target arm controller (NO in step S22), the opposite arm controller performs the discharging task for the opposite arm switch to thereby turn off of maintain off the opposite arm switch in step S23.

Otherwise, upon determining that the on command for switching the opposite arm switch from the off state to the on state has been input thereto from the target arm controller (YES in step S22), the opposite arm controller serves as, for example, the protective driver to perform the charging task for the opposite arm switch to thereby turn on the opposite arm switch independently of the off command being input thereto in step S21. After the operation in step S21 or S23, the opposite arm controller terminates the target-arm switch driving routine.

As described above, one of the upper-arm drive circuit DrCH and the lower-arm drive circuit DrCL is configured to turn off the target arm switch, and the other thereof is configured to turn on the opposite arm switch when an overcurrent failure has occurred in the target arm switch.

The following describes benefits achieved by the above configuration of the target arm drive circuit and the opposite arm drive circuit for each phase with reference to FIGS. 5A to 5E.

FIG. 5A schematically illustrates how the lower-arm switch SL is driven over time, and FIG. 5B schematically illustrates how the upper-arm switch SH is driven over time. FIG. 5C schematically illustrates how a drain current IdsL flowing through the lower-arm switch SL is changed over time, and FIG. 5D also schematically illustrates how a drain current IdsH flowing through the upper-arm switch SH is changed over time. Additionally, FIG. 5E schematically illustrates how the amount of heat generated from the upper-arm switch SH is changed over time. Note that, in each of FIGS. 5A to 5E, the lower-arm switch SL corresponds to the target arm switch, and the upper-arm switch SH corresponds to the opposite arm switch.

The lower arm controller 50, which serves as the target arm controller, determines that an overcurrent failure has occurred in the lower-arm switch SL at time t1, because the target arm voltage Vsr has exceeded the overcurrent threshold Vct (see step S13). Then, the lower-arm switch SL is turned off at the time t1 and the failure determination flag F is set to 1 (see step S15), so that the drain current IdsL flowing through the lower-arm switch SL starts to decrease at the time t1. The turn-off of the lower-arm switch SL causes the gate voltage Vgs of the lower-arm switch SL to fall down below the threshold voltage Vth (YES in step S16), so that the on command for the upper-arm switch SH is output from the lower arm controller 50 to the upper arm controller 40, which corresponds to the opposite arm controller (see step S17). This causes the upper arm controller 40 to switch the upper-arm switch SH from the off state to the on state, resulting in the drain current IdsH for the upper-arm switch SH starting to flow from zero.

The following describes a comparative example compared with the first embodiment. The comparative example is configured such that the upper-arm switch SH is maintained in the off state even if the lower-arm switch SL has been turned off due to the occurrence of an overcurrent failure in the lower-arm switch SL. In the comparative example, when the lower-arm switch SL is switched from the on state to the off state, a flyback current flows through the upper-arm diode DH. At that time, the resistance across the upper-arm diode DH is higher than the on resistance of the on-state upper-arm switch SH. For this reason, the amount of heat (see a dot-and-dash line in FIG. 5E) generated from the upper-arm diode DH through which the flyback flows is higher than the amount of heat (see a solid line in FIG. 5E) generated from the upper-arm switch SH through which the drain current IdsH flows.

In contrast, the first embodiment is configured to switch the upper-arm switch SH from the off state to the on state in response to the occurrence of an overcurrent failure in the lower-arm switch SL. This enables the amount of heat (see the solid line in FIG. 5E) generated from the upper-arm switch SH through which the drain current IdsH flows to be lower, preventing a reduction in the reliability of the upper-arm switch SH, i.e. the opposite arm switch. Note that, if the upper-arm switch is the target arm switch, and the lower-arm switch is the opposite arm switch, the first embodiment also prevents a reduction in the reliability of the lower-arm switch SL, i.e. the opposite arm switch.

As described above, the lower arm controller 50, i.e. the target-arm controller, of the first embodiment is configured to set the failure determination flag F to 0 upon determining that the target arm voltage Vsr is equal to or lower than the overcurrent threshold Vct has elapsed for the predetermined period PE (see FIG. 5E). This causes the lower-arm switch SL to be switched from the off state to the on state, and the upper-arm switch SH to be switched from the on state to the off state at the time t2. Note that each of FIGS. 5C to 5E shows change of the corresponding parameter using a dashed line if the upper-arm switch SH is in the on state and the lower-arm switch SL is in the off state. This control illustrated in the dashed line can be carried out while, for example, a vehicle is safely pulled over in a limp-home mode when the control system CS is installed in the vehicle.

The first embodiment described in detail above obtains the following benefits.

The target arm controller is configured to turn off the target arm switch upon determining that an overcurrent failure has occurred in the target arm switch, and the opposite arm controller is configured to turn on the opposite arm switch. This configuration results in reduction of the amount of heat generated from the opposite arm switch, thus preventing a reduction in the reliability of the opposite arm switch due to flow of a flyback current through its intrinsic diode.

In particular, no additional diodes are provided to be connected in antiparallel to the respective upper- and lower-arm switches SH and SL. This results in a flyback current flowing through only the intrinsic diode of the opposite arm switch, resulting in the amount of heat generated from the opposite arm switch being likely to be larger. This therefore achieves a large benefit from the configuration that turns on the opposite arm switch when an overcurrent failure has occurred in the target arm switch.

If the target arm switch were maintained in the off state after turn-on of the opposite arm switch, a short-circuit would occur between the upper- and lower-arm switches SH and SL. The first embodiment therefore forcibly turns off the target arm switch before turn-on of the opposite arm switch. After turn-off of the target arm switch, a flyback current, which has started to flow through the opposite arm diode, prevents a short-circuit between the upper- and lower-arm switches SH and SL even if the opposite arm switch is switched from the off state to the on state.

From this viewpoint, the target arm controller is configured to instruct the opposite arm controller to turn on the opposite arm switch at a timing after an estimated timing at which a flyback current is estimated to start to flow through the opposite arm diode due to turn-off of the target arm switch. Specifically, the target arm controller is configured to instruct the opposite arm controller to turn on the opposite arm switch when the gate voltage Vgs of the target arm switch becomes lower than the threshold voltage Vth. This is because, when the gate voltage Vgs of the target arm switch is lower than the threshold voltage Vth, a drain current flowing through the target arm switch starts to decrease while a flyback current to start to flow upward through the opposite arm diode.

This configuration therefore prevents the upper- and lower-arm switches SH and SL from being short-circuited when the opposite arm switch is switched from the off state to the on state.

The following describes a modification of the first embodiment.

In step S16, the target arm controller according to this modification determines whether the gate voltage Vgs has lowered below a predetermined voltage. The predetermined voltage is set to a value of the gate voltage Vgs; the value of the gate voltage Vge corresponds to a predetermined amount of a flyback current flowing through the opposite arm switch. The predetermined amount of the flyback current flowing through the opposite arm switch causes the amount of heat generated from the opposite arm switch to exceed an allowable upper limit.

This modification enables the opposite arm switch to be maintained in the off state as long as the amount of heat generated from the opposite arm switch does not exceed the allowable upper limit even if the occurrence of an overcurrent failure in the target arm switch causes the target arm switch to be forcibly turned off.

This modification obtains the same benefits as those obtained by the first embodiment.

Second Embodiment

Figure 7C:
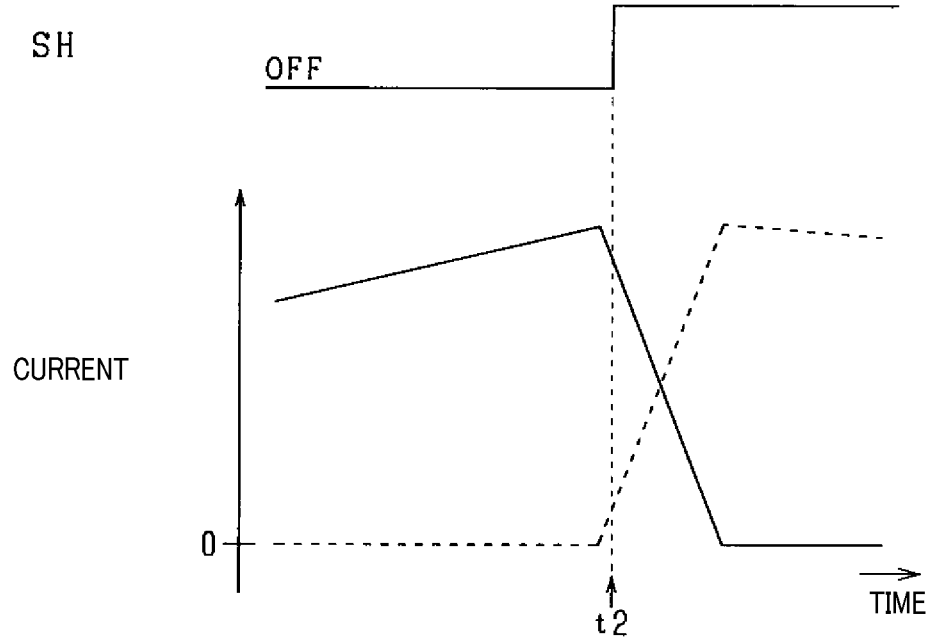

The following describes the second embodiment of the present disclosure with reference to FIGS. 6 to 7C. The second embodiment is different from the first embodiment by the following points. So, the following mainly describes the different points, and omits or simplifies descriptions of like parts between the first and second embodiments, to which identical or like reference characters are assigned, thus eliminating redundant description.

The target arm controller of the second embodiment is configured to (1) Perform determination of whether a drain current Ids flowing through the target arm switch has started to decrease upon determining that an overcurrent has occurred in the target arm switch (2) Instruct the opposite arm controller to turn on the opposite arm switch upon determining that the drain current Ids flowing through the target arm switch has started to decrease That is, when the drain current flowing through the target arm switch starts to decrease based on change of the target arm switch from the on state to the off state, the flyback current starts to flow upward through the opposite arm diode. From this viewpoint, the target control unit of the second embodiment instructs the opposite arm controller to turn on the opposite arm switch after the flyback current starts to flow through the opposite arm diode. This prevents the upper- and lower-arm switches from being short-circuited between each other even if the opposite arm switch is turned on.

The following describes a target-arm switch driving routine carried out by the target arm controller according to the second embodiment with reference to FIG. 6. The target arm controller is configured to perform the target-arm switch driving routine every predetermined control period. Like steps between the target-arm switch driving routine illustrated in FIG. 6 and the target-arm switch driving routine illustrated in FIG. 3, to which like step numbers are assigned, are omitted or simplified in description.

After completion of the operation in step S15 or when the negative determination in step S10 is performed, the target-arm switch driving routine proceeds to step S18.

In step S18, the target arm controller serves as, for example, the protective driver to determine whether the drain current Ids flowing through the target arm switch has stated to decrease. Upon determining that the drain current Ids flowing through the target arm switch has not stated to decrease (NO in step S18), the target arm controller terminates target-arm switch driving routine. Otherwise, upon determining that the drain current Ids flowing through the target arm switch has stated to decrease (YES in step S18), the target arm controller performs the operation in step S17 set forth above.

The following describes the operations in steps S17 and S18 with reference to FIGS. 7A to 7C. FIGS. 7A and 7B respectively correspond to FIGS. 5A and 5B. FIG. 7C schematically illustrates how the drain current Ids flowing through the lower-arm switch SL using a solid line, and also illustrates how the sum of the drain current Ids flowing through the upper-arm switch SH and a flyback current flowing through the upper-arm diode DH.

The lower arm controller 50, which serves as the target arm controller, determines that an overcurrent failure has occurred in the lower-arm switch SL at time t11. Then, the lower-arm switch SL is turned off at the time t11, so that the drain current IdsL flowing through the lower-arm switch SL starts to decrease at the time t11, and the flyback current starts to flow upward through the upper-arm diode DH at the time t11.

Thereafter, at time t12, it is determined that the drain current IdsL flowing through the lower-arm switch SL has stated to decrease (YES in step S18). This causes the lower arm controller 50 to output the on command for the upper-arm switch SH to the upper arm controller 40 before the drain current IdsL illustrated in FIG. 7C becomes zero. This results in the upper arm controller 40 switching the upper-arm switch SH from the off state to the on state.

The second embodiment obtains the same benefits as those obtained by the first embodiment.

As a modification of the second embodiment, the target arm controller can be configured to instruct the opposite arm controller to turn on the opposite arm switch when the drain current Ids flowing through the target arm switch becomes zero. This modification obtains the same benefits as those obtained by the second embodiment.

Third Embodiment

Figure 8:
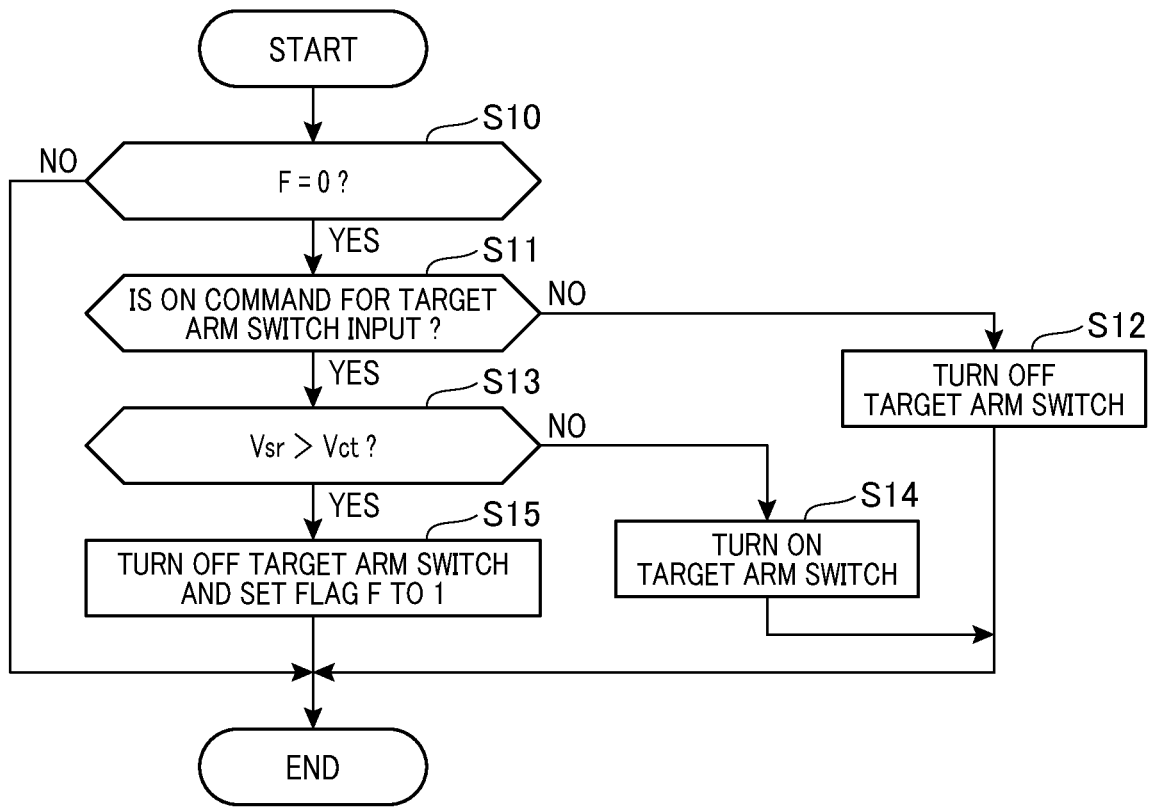
FIG. 8 is a flowchart schematically illustrating a target-arm switch driving routine according to the third embodiment of the present disclosure.
Figure 9:
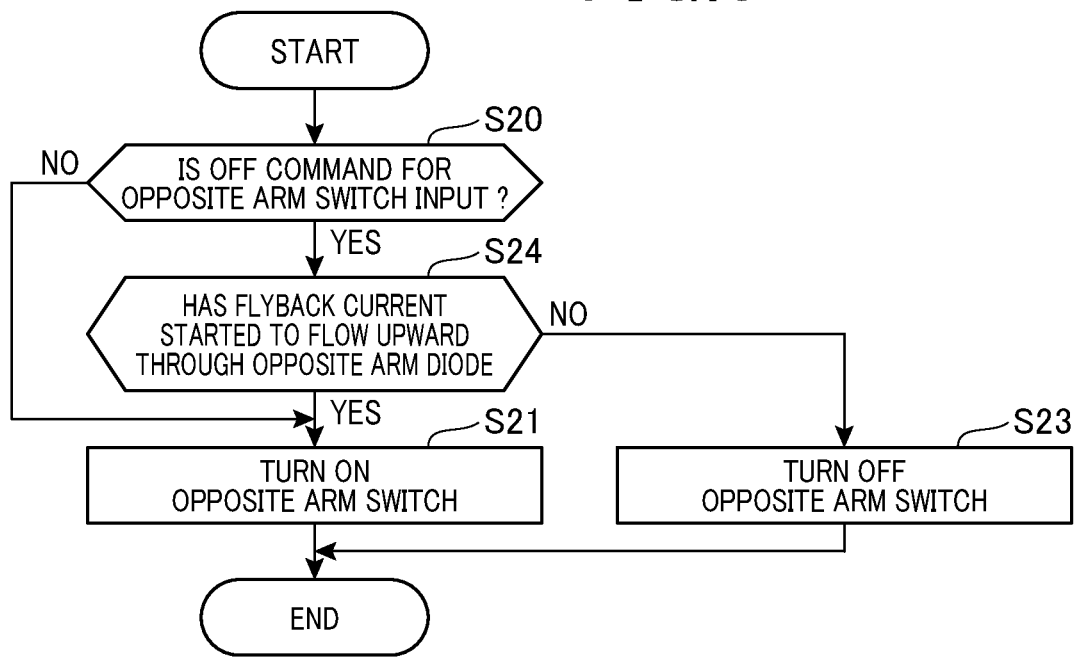
FIG. 9 is a flowchart schematically illustrating an opposite-arm switch driving routine according to the third embodiment of the present disclosure.

The following describes the third embodiment of the present disclosure with reference to FIGS. 8 and 9. The third embodiment is different from the first embodiment by the following points. So, the following mainly describes the different points, and omits or simplifies descriptions of like parts between the first and third embodiments, to which identical or like reference characters are assigned, thus eliminating redundant description.

The opposite control unit of the third embodiment is configured to (1) Perform determination of whether a flyback current flowing through the opposite arm diode has started to increase from zero after turn-off of the target arm switch upon it being determined that an overcurrent has occurred in the target arm switch (2) Turn on the opposite arm switch upon determining that the flyback current has started to flow upward from zero That is, when the drain current flowing through the target arm switch starts to decrease based on change of the target arm switch from the on state to the off state, the flyback current start to flow upward through the opposite arm diode. From this viewpoint, the opposite arm controller of the third embodiment is capable of recognizing the occurrence of an overcurrent failure in the target arm switch in accordance with an increase of the flyback current. This therefore enables a signal line between the target and opposite arm controllers for transferring the on command from the target arm controller to the opposite arm controller to be eliminated.

The following describes a target-arm switch driving routine carried out by the target arm controller according to the third embodiment with reference to FIG. 8. The target arm controller is configured to perform the target-arm switch driving routine every predetermined control period. Like steps between the target-arm switch driving routine illustrated in FIG. 8 and the target-arm switch driving routine illustrated in FIG. 3, to which like step numbers are assigned, are omitted or simplified in description.

Specifically, as illustrated in FIG. 8, the target arm controller terminates the target-arm switch driving routine after completion of the operation in step S15 without performing the operations in steps S16 and S17.

The following describes an opposite-arm switch driving routine carried out by the opposite arm controller according to the third embodiment with reference to FIG. 9. The opposite arm controller is configured to perform the opposite-arm switch driving routine every predetermined control period. Like steps between the opposite-arm switch driving routine illustrated in FIG. 9 and the opposite-arm switch driving routine illustrated in FIG. 4, to which like step numbers are assigned, are omitted or simplified in description.

Upon determining that the off command for the opposite arm switch has been input thereto (YES in step S20), the opposite arm controller serves as, for example, the protective driver to determine, based on the opposite arm voltage, whether the flyback current has started to flow upward from zero in step S24. When it is determined that the flyback current has not started to flow upward from zero (NO in step S24), the opposite arm controller performs the operation in step S23.

Otherwise, when it is determined that the flyback current has started to flow upward from zero (YES in step S24), the opposite arm controller performs the operation in step S21.

This configuration of the third embodiment therefore enables a signal line between the upper- and lower arm controllers for transferring the on command from the target arm controller to the opposite arm controller to be eliminated.

As a modification of the third embodiment, the opposite arm controller can be configured to obtain a terminal voltage, i.e. a drain-source voltage Vds, between the high- and low-side terminals of the opposite arm switch, and determine whether the obtained drain-source voltage Vds has started to increase upward from zero in step S24. Upon determining that the obtained drain-source voltage Vds has started to increase upward from zero (YES in step S24), the opposite arm controller can be configured to turn on the opposite arm switch, because the fact that the drain-source voltage Vds has started to increase upward from zero represents that the target arm switch is in the off state.

This modification obtains the same benefits as those obtained by the third embodiment.

Fourth Embodiment

Figure 10:
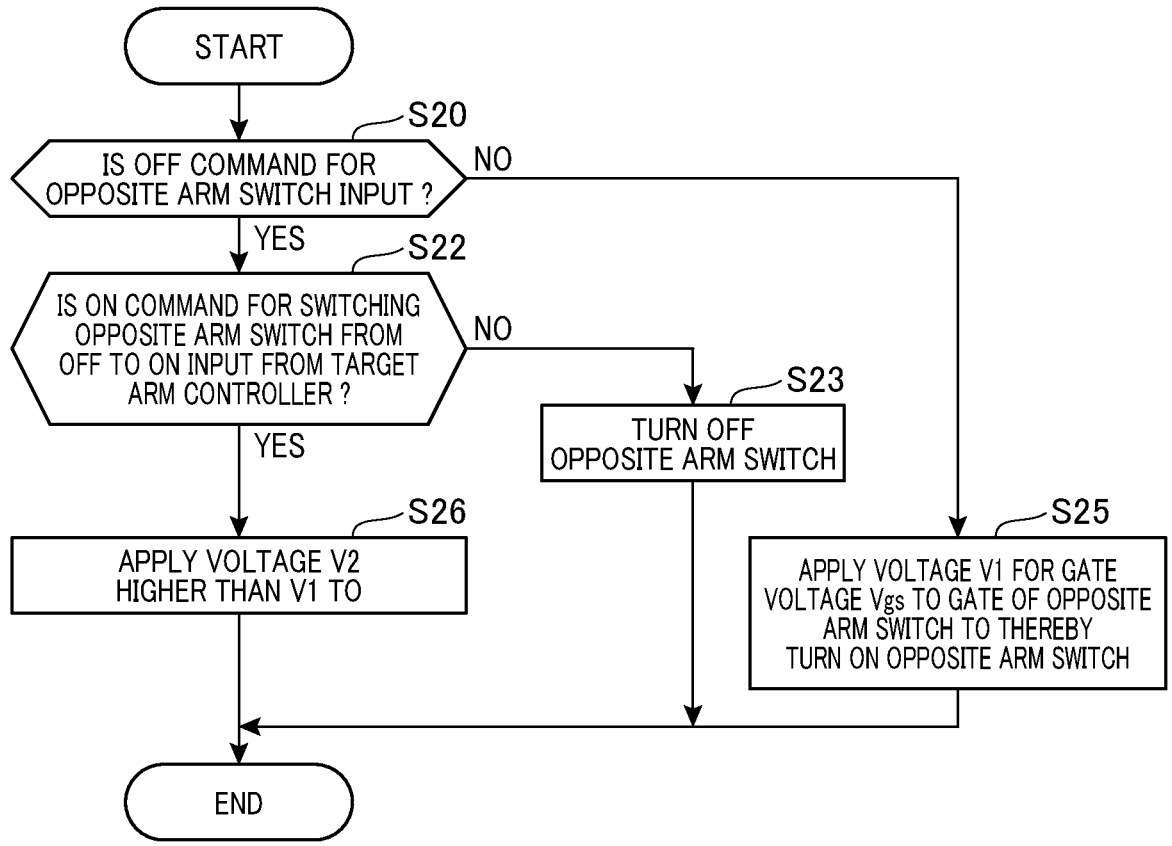
FIG. 10 is a flowchart schematically illustrating an opposite-arm switch driving routine according to the third embodiment of the present disclosure.
Figure 11:
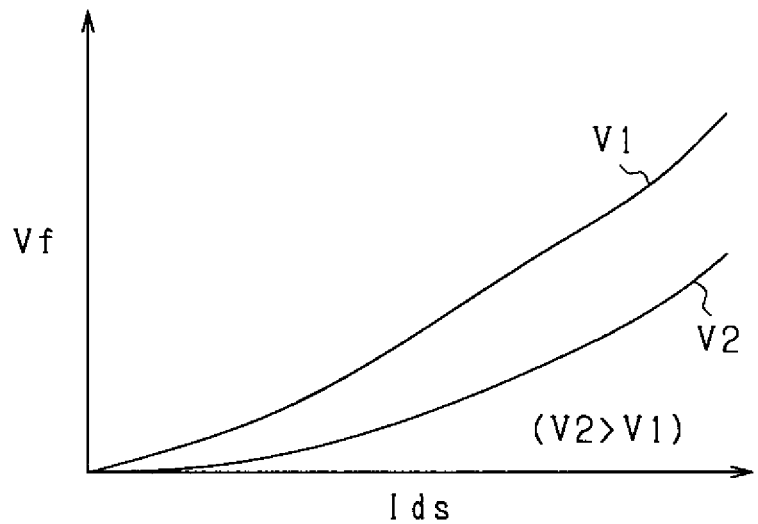
FIG. 11 is a graph schematically illustrating an example of a relationship between a voltage drop across a switch and each of different values of a gate voltage applied to the switch according to the first embodiment of the present disclosure.
Figure 12:
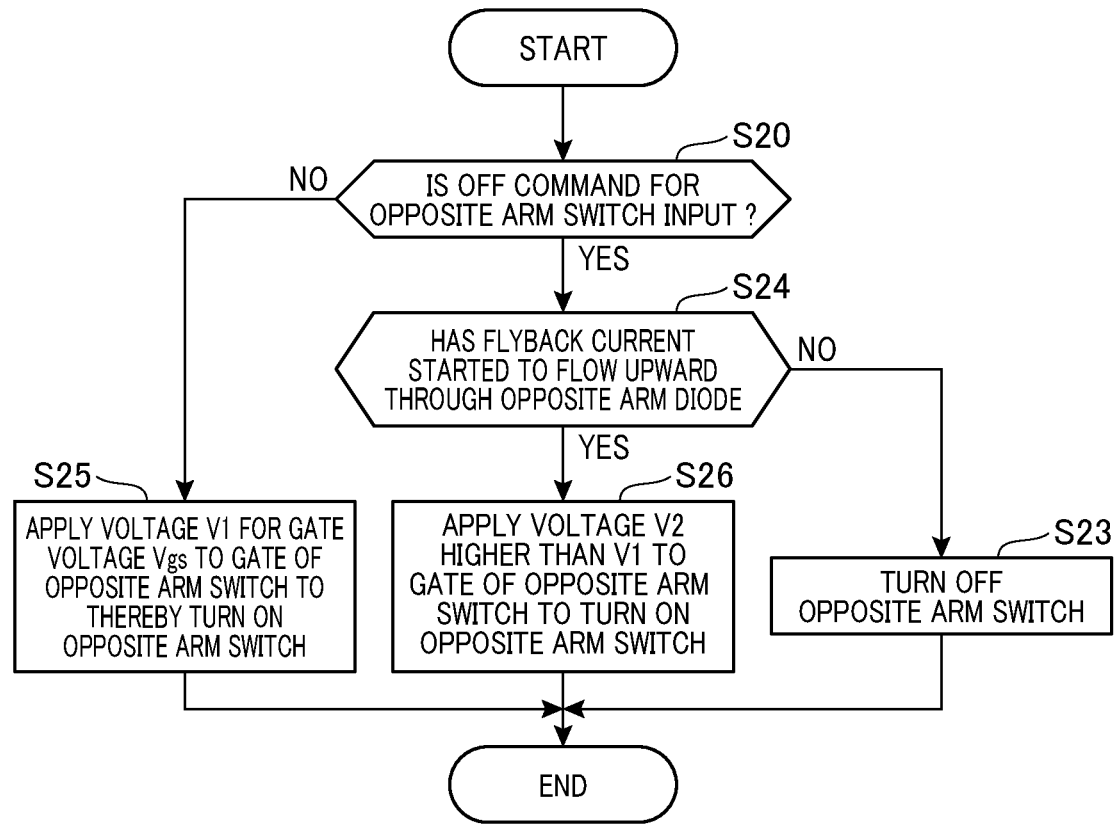
FIG. 12 is a flowchart schematically illustrating an opposite-arm switch driving routine according to the fourth embodiment of the present disclosure.

The following describes the fourth embodiment of the present disclosure with reference to FIGS. 10 to 12.

The fourth embodiment is different from the first embodiment by the following points. So, the following mainly describes the different points, and omits or simplifies descriptions of like parts between the first and fourth embodiments, to which identical or like reference characters are assigned, thus eliminating redundant description.

The opposite control unit of the fourth embodiment is configured to (1) Apply, as the gate voltage Vgs, a first voltage V1 to the gate of the opposite arm switch in response to the on command being input thereto from the control apparatus 30

(2) Apply, as the gate voltage Vgs, a second voltage V2, which is higher than the first voltage V1, to the gate of the opposite arm switch in response to the on command being input thereto from the target arm controller that deter mines the occurrence of an overcurrent failure in the target arm switch The following describes an opposite-arm switch driving routine carried out by the opposite arm controller according to the fourth embodiment with reference to FIG. 10. The opposite arm controller is configured to perform the opposite-arm switch driving routine every predetermined control period. Like steps between the opposite-arm switch driving routine illustrated in FIG. 10 and the opposite-arm switch driving routine illustrated in FIG. 4, to which like step numbers are assigned, are omitted or simplified in description.

Upon determining that the off command for the opposite arm switch is not input thereto from the control apparatus 30 (NO in step S20), the opposite arm controller determines that the on command for the opposite arm switch has been input thereto. Then, the opposite arm controller serves as, for example, the main driver to perform the charging task for the opposite arm switch to thereby apply, as the gate voltage Vgs, the first voltage V1 higher than the threshold voltage Vth, thus turning on the opposite arm switch in step S25.

In addition, upon determining that the off command for the opposite arm switch has been input thereto (YES in step S20), the opposite arm controller determines whether the on command for switching the opposite arm switch from the off state to the on state has been input thereto in step S22.

Upon determining that the on command for switching the opposite arm switch from the off state to the on state has been input thereto (YES in step S22), the opposite arm controller serves as, for example, the protective driver to perform the charging task for the opposite arm switch to thereby apply, as the gate voltage Vgs, the second voltage V2 higher than the first voltage V1 to the opposite arm switch, thus turning on the opposite arm switch independently of the off command being input thereto in step S26.

FIG. 11 schematically shows that the on resistance of the opposite arm switch when the second voltage V2 is applied as the gate voltage thereto is lower than the on resistance of the opposite arm switch when the first voltage V1 is applied as the gate voltage thereto. This results in a voltage drop Vf across the opposite arm switch when the second voltage V2 is applied as the gate voltage thereto is also lower than the voltage drop Vf across the opposite arm switch when the first voltage V1 is applied as the gate voltage thereto.

This therefore increases the gate voltage Vgs applied to the gate of the opposite arm switch when an overcurrent failure has occurred in the target arm switch, making it possible to reduce the amount of heat generated from the opposite arm switch.

The fourth embodiment also obtains the same benefits as those obtained by the first embodiment.

The following describes a modification of the fourth embodiment.

Specifically, an opposite-arm switch driving routine carried out by the opposite arm controller according to this modification of the fourth embodiment is slightly different from the opposite-arm switch driving routine according to the fourth embodiment.

The following describes the opposite-arm switch driving routine according to this modification of the fourth embodiment with reference to FIG. 12. The opposite arm controller is configured to perform the opposite-arm switch driving routine every predetermined control period. Like steps between the opposite-arm switch driving routine illustrated in FIG. 12 and the opposite-arm switch driving routine illustrated in each of FIGS. 9 and 10, to which like step numbers are assigned, are omitted or simplified in description.

The opposite arm controller serves as, for example, the protective driver to determine, based on the opposite arm voltage, whether the flyback current has started to flow upward from zero in step S24. When it is determined that the flyback current has not started to flow upward from zero (NO in step S24), the opposite arm controller performs the operation in step S23.

Otherwise, when it is determined that the flyback current has started to flow upward from zero (YES in step S24), the opposite arm controller performs the operation in step S26.

This modification of the fourth embodiment obtains the same benefits as those obtained by the first embodiment, and the same benefit as that obtained by the third embodiment.

Fifth Embodiment

The following describes the fifth embodiment of the present disclosure with reference to FIGS. 13 to 16. The fifth embodiment is different from the first embodiment by the following points. So, the following mainly describes the different points, and omits or simplifies descriptions of like parts between the first and fifth embodiments, to which identical or like reference characters are assigned, thus eliminating redundant description.

A drive circuit according to the fifth embodiment is embodied as a component of a control system CSA for controlling the rotary electric machine 10.

The control system CSA includes an inverter 20A.

The inverter 20A includes three (UVW)-phase switch members for the respective three-phase of the rotary electric machine 10.

The switch member for each phase is comprised of first and second upper-arm switches SH1 and SH2 parallely connected to each other, and first and second lower-arm switches SL1 and SL2 parallely connected to each other. For each phase, the upper-arm assembly MH of the upper-arm switches SH1 and SH2 and the lower-arm assembly ML of the lower-arm switches SL1 and SL2 are connected in series to each other.

The fifth embodiment uses, as each of the upper- and lower-arm switches SH1, SH2, SL1, and SL2, an N-channel MOSFET, which is a unipolar, wide-bandgap semiconductor switch, such as a silicon carbide (SiC) switch or a Gallium nitride (GaN) switch.

The first and second upper-arm switches SH1 and SH2 for each phase have the same structure, and the first and second lower-arm switches SL1 and SL2 for each phase have the same structure.

Each of the first and second upper-arm switches SH1 and SH2 for each phase incorporates, as its intrinsic diode, a corresponding one of first and second upper-arm diodes DH1 and DH2. Similarly, each of the first and second lower-arm switches SL1 and SL2 for each phase incorporates, as its intrinsic diode, a corresponding one of first and second lower-arm diodes DL1 and DL2.

The anode of each of the first and second upper-arm diodes DH1 and DH2 is connected to the source of the corresponding one of the switches SH1 and SH2, and the cathode of each of the first and second upper-arm diodes DH1 and DH2 is connected to the drain of the corresponding one of the switches SH1 and SH2. Similarly, the anode of each of the first and second lower-arm diodes DL1 and DL2 is connected to the source of the corresponding one of the switches SL1 and SL2, and the cathode of each of the first and second lower-arm diodes DL1 and DL2 is connected to the drain of the corresponding one of the switches SL1 and SL2.

The connection point between the upper-arm assembly MH and the lower-arm assembly ML for each phase is connected to the first end of the corresponding one of the three-phase stator coils 11.

The upper-arm drive circuits DrCH are provided for the respective upper-arm assemblies MH and connected to the control terminals, such as the gates, of the respective first and second upper-arm switches SH1 and SH2. Similarly, the lower-arm drive circuits DrCL are provided for the respective lower-arm assemblies ML and connected to the control terminals, such as the gates, of the respective first and second lower-arm switches SL1 and SL2.

The control apparatus 30 is controllably connected to the upper-drive and lower-arm circuits DrCH and DrCL.

The control apparatus 30 is configured to control on-off switching operations of each of the first and second upper-arm switches SH1 and Sh2 for each phase via the corresponding one of the upper-arm drive circuits DrCH, and on-off switching operation of each of the first and second lower-arm switches SL1 and SL2 via the corresponding one of the lower-arm drive circuits DrCL to thereby control the controlled variable, such as torque, of the rotary electric machine 10 to a commanded value or a requested value.

Specifically, the control apparatus 30 is configured to output, for each phase, (1) First and second upper-arm drive signals to the corresponding upper-arm drive circuit DrCH (2) First and second lower-arm drive signals to the corresponding lower-arm drive circuit DrCL This causes the upper- and lower-arm drive circuits DrCH and DrCL of each phase to alternately turn on the upper-arm assembly MH of the first and second upper-arm switches SH1 and SH2 and the lower-arm assembly ML of the first and second lower-arm switches SL1 and SL2 while ensuring deadtimes between (1) Turn-off timing of the upper-arm assembly MH of the switches SH1 and SH2 and turn-on timing of the lower-arm assembly ML of the switches SL1 and SL2

(2) Turn-on timing of the upper-arm assembly MH of the switches SH1 and SH2 and turn-off timing of the lower-arm assembly ML of the switches SL1 and SL2

The upper-arm drive circuit DrCH is configured to simultaneously perform the charging task for the first and second upper-arm switches SH1 and SH2 in response to the on command input thereto. In addition, the upper-arm drive circuit DrCH is configured to simultaneously perform the discharging task for the first and second upper-arm switches SH1 and SH2 in response to the off command input thereto.

Similarly, the lower-arm drive circuit DrCL is configured to simultaneously perform the charging task for the first and second lower-arm switches SL1 and SL2 in response to the on command input thereto. In addition, the lower-arm drive circuit DrCL is configured to simultaneously perform the discharging task for the first and second lower-arm switches SL1 and SL2 in response to the off command input thereto.

Figure 14:
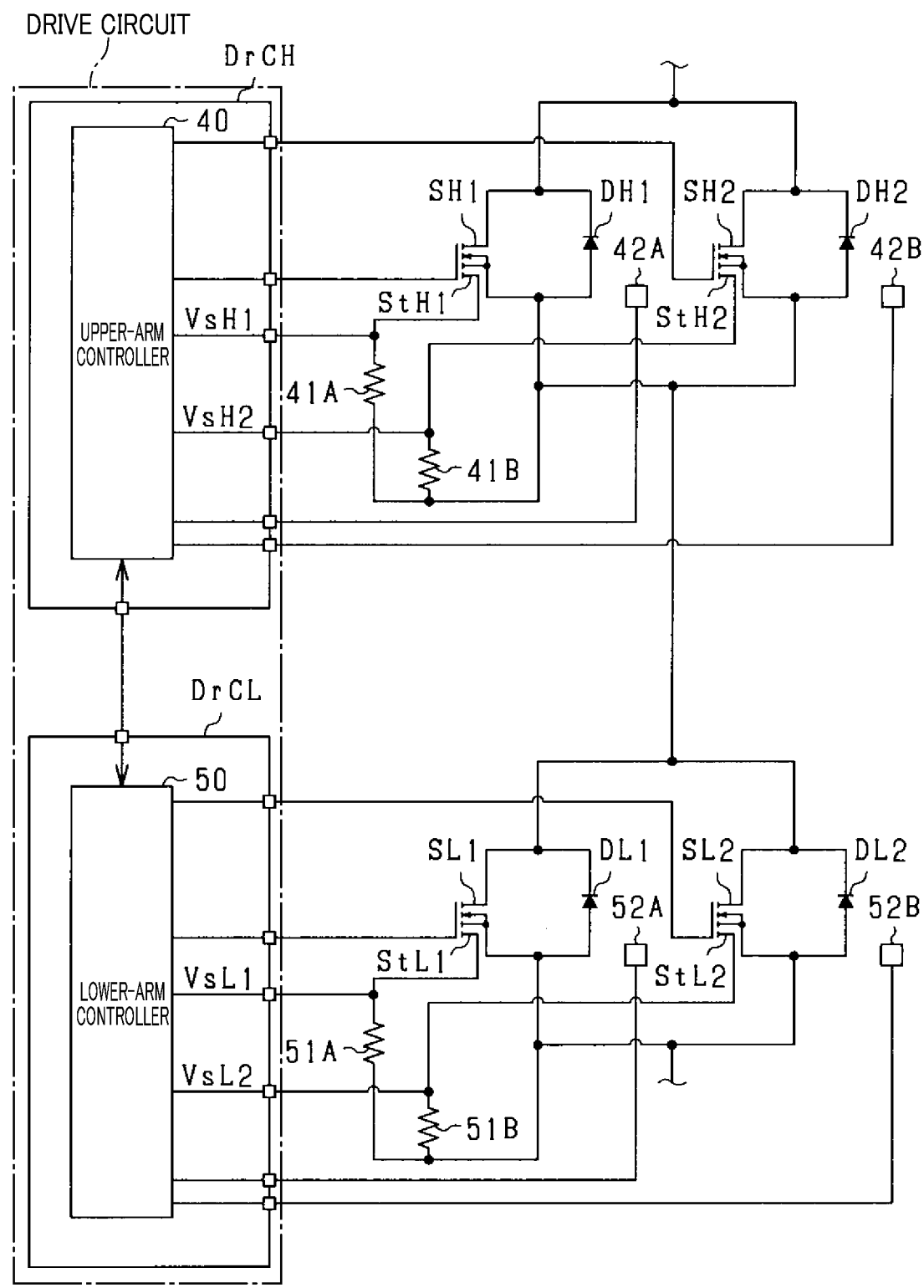
FIG. 14 is a circuit diagram schematically illustrating an example of the structure of each of an upper-arm drive circuit and a lower-arm drive circuit illustrated in FIG. 13.

Next, the following describes each of the upper- and lower drive circuits DrCH and DrCL with reference to FIG. 14.

First, the following describes the upper-arm drive circuits DrCH.

Each upper-arm drive circuit DrCH includes an upper arm controller 40. The upper arm controller 40 is connected to the control apparatus 30, and receives the first and second upper-arm drive signals sent from the control apparatus 30.

The upper arm controller 40 determines whether each of the first and second upper-arm drive signals is the on-command, and performs the charging task upon determining that each of the first and second upper-arm drive signals is the on-command, thus turning on the first and second upper-arm switches SH1 and SH2.

Otherwise, the upper arm controller 40 performs the discharging task upon determining that each of the first and second upper-arm drive signals is the off-command, thus turning off the first and second upper-arm switches SH1 and SH2.

Each of the first and second upper-arm switches SH1 and SH2 has a corresponding one of first and second upper-arm sense terminals StH1 and StH2 for outputting a minute current, i.e. a sense current, associated with (1) A drain current flowing through the conductive path between the source and drain of the corresponding one of the first and second upper-arm switches SH1 and SH2

(2) A flyback current flowing through the corresponding one of the first and second upper-arm diodes DH1 and DH2

The first sense terminal StH1 is connected to a first end of a first upper-arm sense resistor 41A, and a second end, opposing the first end, of the first upper-arm sense resistor 41A is connected to the source of the corresponding first upper-arm switch SH1 via the common signal ground.

Similarly, the second sense terminal StH2 is connected to a first end of a second upper-arm sense resistor 41B, and a second end, opposing the first end, of the second upper-arm sense resistor 41B is connected to the source of the corresponding second upper-arm switch SH2 via the common signal ground.

When the sense current flows through each of the first and second upper-arm sense resistors 41A and 41B, a voltage drop across the corresponding one of the first and second upper-arm sense resistors 41A and 41B occurs. Thus, a voltage at the first end of the first upper-arm sense resistor 41A relative to the source potential of the first upper-arm switch SH1 will be referred to as a first upper-arm sense voltage VsH1, and a voltage at the first end of the second upper-arm sense resistor 41B relative to the source potential of the second upper-arm switch SH2 will be referred to as a second upper-arm sense voltage VsH2.

Each of the first and second upper-arm sense voltages VsH1 and VsH2 serves as, for example, an electric state parameter correlating with the magnitude of the drain current or the flyback current for the corresponding one of the first and second upper-arm switches SH1 and SH2.

The potential at the source of the each of the first and second upper-arm switches SH1 and SH2 is set to zero, and, when the potential at the first end of each of the first and second upper-arm sense resistors 41A and 41B is higher than the source potential, each of the first and second upper-arm sense voltages VsH1 and VsH2 is defined to have a positive potential. The first end of each of the first and second upper-arm sense resistors 41A and 41B is connected to the upper arm controller 40 via a corresponding one of terminals of the upper-arm switch DrCH, so that the first and second upper-arm sense voltages VsH1 and VsH2 are sent to the upper arm controller 40.

Additionally, first and second upper-arm temperature sensors 42A and 42B are provided to be close to the respective first and second upper-arm switches SH1 and SH2. Each of the first and second upper-arm temperature sensors 42A and 42B is comprised of, for example, a temperature-sensitive diode or a thermistor, and is configured to individually measure the temperature of the corresponding one of the first and second upper-arm switches SH1 and SH2. Then, each of the first and second upper-arm temperature sensors 42A and 42B is configured to output a signal indicative of the measured temperature of the corresponding one of the first and second upper-arm switches SH1 and SH2 to the upper arm controller 40. The upper arm controller 40 obtains the temperature of each of the first and second upper-arm switches SH1 and SH2 based on the corresponding one of the output signals output from the first and second upper-arm temperature sensors 42A and 42B.

Next, the following describes the lower-arm drive circuits DrCL.

Each lower-arm drive circuit DrCL includes a lower arm controller 50. The lower arm controller 50 is connected to the control apparatus 30, and receives the first and second lower-arm drive signals sent from the control apparatus 30.

The upper- and lower arm controllers 40 and 50 are communicably connected to each other.

The lower arm controller 50 determines whether each of the first and second lower-arm drive signals is the on-command, and performs (1) The charging task of each of the first and second lower-arm switches SL1 and SL2 upon determining that the corresponding one of the first and second lower-arm drive signal is the on-command (2) The discharging task of each of the first and second lower-arm switches SL1 and SL2 upon determining that the corresponding one of the first and second lower-arm drive signal is the off-command Because each of the charging task and discharging task of the lower-arm drive circuit DrCL is substantially identical to the corresponding one of the charging task and discharging task of the upper-arm drive circuit DrCH, the description of each of the charging task and discharging task of the lower-arm drive circuit DrCL will be omitted.

Each of the first and second lower-arm switches SL1 and SL2 has a corresponding one of first and second lower-arm sense terminals StL1 and StL2 for outputting a minute current, i.e. a sense current, associated with (1) A drain current flowing through the conductive path between the source and drain of the corresponding one of the first and second lower-arm switches SL1 and SL2

(2) A flyback current flowing through the corresponding one of the first and second lower-arm diodes DL1 and DL2

The first sense terminal StL1 is connected to a first end of a first lower-arm sense resistor 51A, and a second end, opposing the first end, of the first lower-arm sense resistor 51A is connected to the source of the corresponding first lower-arm switch SL1 via the common signal ground.

Similarly, the second sense terminal StL2 is connected to a first end of a second lower-arm sense resistor 51B, and a second end, opposing the first end, of the second lower-arm sense resistor 51B is connected to the source of the corresponding second lower-arm switch SL2 via the common signal ground.

When the sense current flows through each of the first and second lower-arm sense resistors 51A and 51B, a voltage drop across the corresponding one of the first and second lower-arm sense resistors 51A and 51B occurs. Thus, a voltage at the first end of the first lower-arm sense resistor 51A relative to the source potential of the first lower-arm switch SL1 will be referred to as a first lower-arm sense voltage VsL1, and a voltage at the first end of the second lower-arm sense resistor 51B relative to the source potential of the second lower-arm switch SL2 will be referred to as a second lower-arm sense voltage VsL2.

Each of the first and second lower-arm sense voltages VsL1 and VsL2 serves as, for example, an electric state parameter correlating with the magnitude of the drain current or the flyback current for the corresponding one of the first and second lower-arm switches SL1 and SL2.

The potential at the source of the each of the first and second lower-arm switches SL1 and SL2 is set to zero, and, when the potential at the first end of each of the first and second lower-arm sense resistors 51A and 51B is higher than the source potential, each of the first and second lower-arm sense voltages VsL1 and VsL2 is defined to have a positive potential. The first end of each of the first and second lower-arm sense resistors 51A and 51B is connected to the lower arm controller 50 via a corresponding one of terminals of the lower-arm switch DrCL, so that the first and second lower-arm sense voltages VsL1 and VsL2 are sent to the lower arm controller 50.

Additionally, first and second lower-arm temperature sensors 52A and 52B are provided to be close to the respective first and second lower-arm switches SL1 and SL2. Each of the first and second lower-am temperature sensors 52A and 52B is comprised of, for example, a temperature-sensitive diode or a thermistor, and is configured to individually measure the temperature of the corresponding one of the first and second lower-arm switches SL1 and SL2. Then, each of the first and second lower-arm temperature sensors 52A and 52B is configured to output a signal indicative of the measured temperature of the corresponding one of the first and second lower-arm switches SL1 and SL2 to the lower arm controller 50. The lower arm controller 50 obtains the temperature of each of the first and second lower-arm switches SL1 and SL2 based on the corresponding one of the output signals output from the first and second lower-arm temperature sensors 52A and 52B.

In the fifth embodiment, one of the pair of the first and second upper-arm switches SH1 and SH2 and the pair of the first and second lower-arm switches SL1 and SL2, which is in the on state based on the charging task in response to the on command sent from the control apparatus 30, will be referred to as a pair of first and second target arm switches.

Additionally, the other of the pair of the first and second upper-arm switches SH1 and SH2 and the pair of the first and second lower-arm switches SL1 and SL2, which is in the off state based on the discharging task in response to the off command sent from the control apparatus 30, will be referred to as a pair of first and second opposite arm switches.

Moreover, one of the pair of the first and second upper-arm diodes DH1 and DH2 and the pair of the first and second lower-arm diodes DL1 and DSL2, which is incorporated in the pair of the respective first and second target arm switches, will be referred to as a pair of first and second target arm diodes.

The other of the pair of the first and second upper-arm diodes DH1 and DH2 and the pair of the first and second lower-arm diodes DL1 and DSL2, which is incorporated in the pair of the respective first and second opposite arm switches, will be referred to as a pair of first and second opposite arm diodes.

One of the upper- and lower arm controllers 40 and 50, which drives the first and second target arm switches, will be referred to as the target arm controller, and the other of the upper- and lower arm controllers 40 and 50, which drives the first and second opposite arm switches, will be referred to as an opposite arm controller.

One of the pair of the first and second upper-arm sense voltages VsH1 and VsH2 and the pair of the first and second lower-arm sense voltages VsL1 and VsL2, which is obtained by the target arm controller, will be referred to as a pair of first and second target arm voltages Vsr1 and Vsr2.

The other of the pair of the first and second upper-arm sense voltages VsH1 and VsH2 and the pair of the first and second lower-arm sense voltages VsL1 and VsL2, which is obtained by the opposite arm controller, will be referred to as a pair of first and second opposite arm voltages Vos1 and Vos2.

Figure 15:
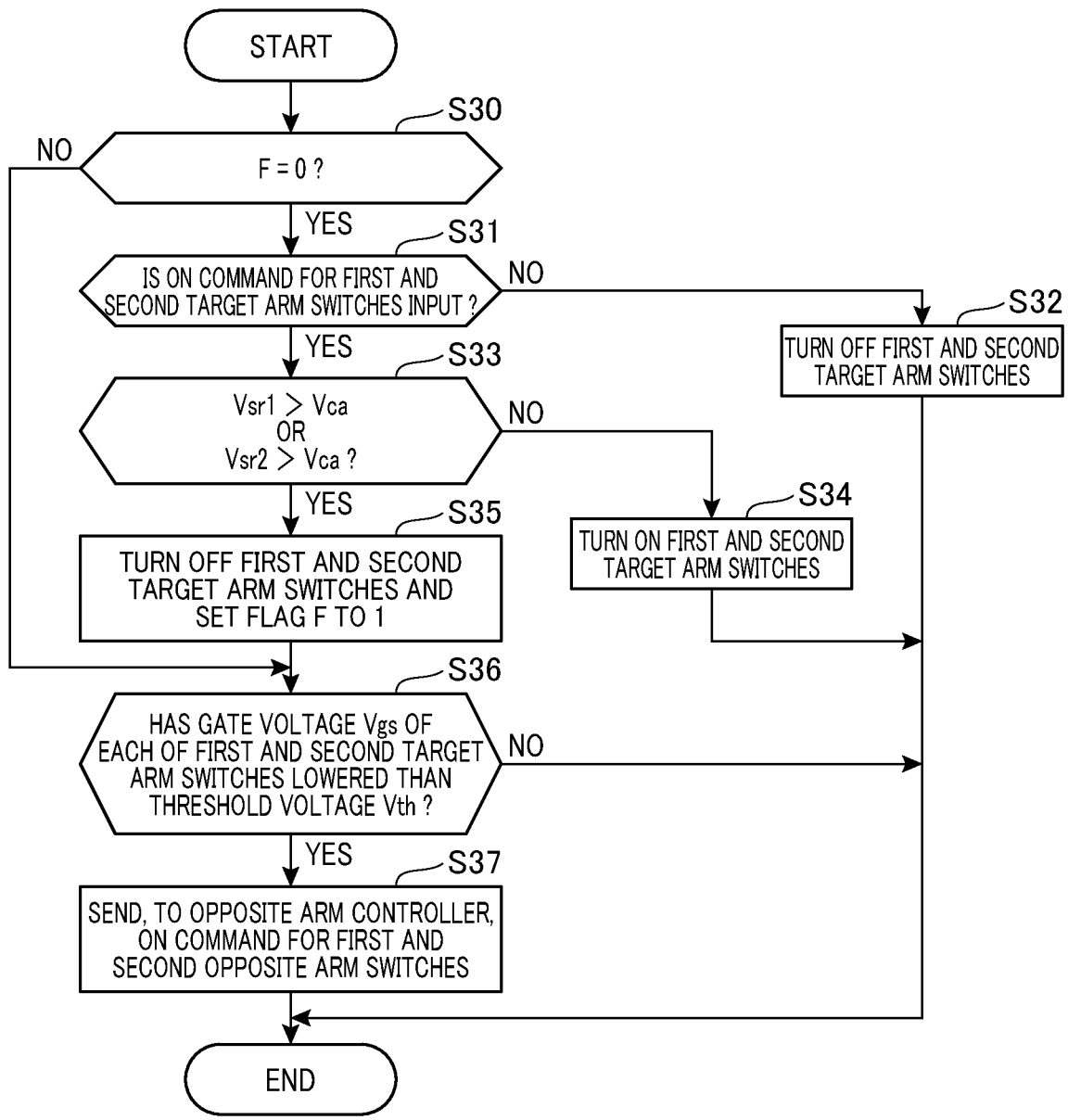
FIG. 15 is a flowchart schematically illustrating a target-arm switch driving routine according to the fifth embodiment of the present disclosure.

The following describes a target-arm switch driving routine carried out by the target arm controller with reference to FIG. 15. The target arm controller is configured to perform the target-arm switch driving routine every predetermined control period.

When starting the target-arm switch driving routine, the target arm controller determines whether the failure determination flag F is set to 0 in step S30. The failure determination flag F is set to the initial value of 0.

Upon determining that the failure determination flag F is set to 0 (YES in step S30), the target arm controller determines whether the on command for the first and second target arm switches has been input thereto in step S31. Upon determining that the on command for the first and second target arm switches is not input thereto (NO in step S31), the target arm controller determines that the off command has been input thereto, and performs the discharging task for the first and second target arm switches to thereby turn off the first and second target arm switches in step S32.

Otherwise, upon determining that the on command for the first and second target arm switches has been input thereto (YES in step S31), the target arm controller determines whether any one of the following first and second conditions are satisfied in step S33:

The first condition is that the first target arm voltage Vsr1 has exceeded an overcurrent threshold Vca The second condition is that the second target arm voltage Vsr2 has exceeded the overcurrent threshold Vca Note that the overcurrent threshold Vca is previously determined such that, when each of the first and second target arm voltages Vsr1 and Vsr2 has exceeded the overcurrent threshold Vca, an overcurrent failure is likely to have occurred in the corresponding one of the first and second target arm voltages Vsr1 and Vsr2. That is, the operation in step S33 is to determine whether an overcurrent failure has occurred in each of the first and second target arm switches.

Upon determining that neither the first condition nor the second condition are satisfied (NO in step S33), the target arm controller performs the charging task for each of the first and second target arm switches to thereby turn on the corresponding one of the first and second target arm switches in step S34.

Otherwise, upon determining that at least one of the first condition and the second condition is satisfied (YES in step S33), the target arm controller sets the failure determination flag F to 1 in step S35. In step S35, the target arm controller forcibly performs the discharging task for each of the first and second target arm switches to thereby turn off the corresponding one of the first and second target arm switches independently of the on command being inputted thereto.

After completion of the operation in step S35 or when the negative determination in step S30 is performed, the target-arm switch driving routine proceeds to step S36.

In step S36, the target arm controller serves as, for example, the protective driver to determine whether the gate voltage Vgs of each of the first and second target arm switches has lowered below the corresponding threshold voltage Vth while the failure determination flag F being set to 1. When it is determined that the gate voltage Vgs of each of the first and second target arm switches has lowered below the corresponding threshold voltage Vth while the failure determination flag F being set to 1 (YES in step S36), the target-arm switch driving routine proceeds to step S37. In step S37, the target arm controller serves as, for example, the protective driver to send, to the opposite arm controller, the on command for switching the first and second opposite arm switches from the off state to the on state, and thereafter, terminates the target-arm switch driving routine.

After the operation in step S32 or step S34, the target arm controller terminates the target-arm switch driving routine.

The operation in step S36 aims to prevent a short-circuit between the upper- and lower-arm switches. That is, there are variations in the threshold voltages Vth of the respective first and second target arm switches. This may result in the timing at which the gate voltage Vgs of the first target arm switch becomes below the corresponding threshold voltage Vth being different from the timing at which the gate voltage Vgs of the second target arm switch becomes below the corresponding threshold voltage Vth even if the discharge tasks for the first and second target arm switches are simultaneously started.

If the first and second opposite arm switches were turned on while one of the gate voltages Vgs of all the first and second target arm switches is equal to or higher than the corresponding threshold voltage Vth, a short-circuit between the upper- and lower-arm switches might occur. For this reason, the operation in step S36 reliably prevents a short-circuit from occurring between the upper- and lower-arm switches.

Note that the target arm controller is configured to set the failure determination flag to 0 upon a predetermined condition being satisfied; the predetermined condition is, for example, a condition that the state where each of the target arm voltages Vsr1 and Vsr2 is equal to or lower than the corresponding overcurrent threshold Vca has elapsed for a predetermined period.

Figure 16:
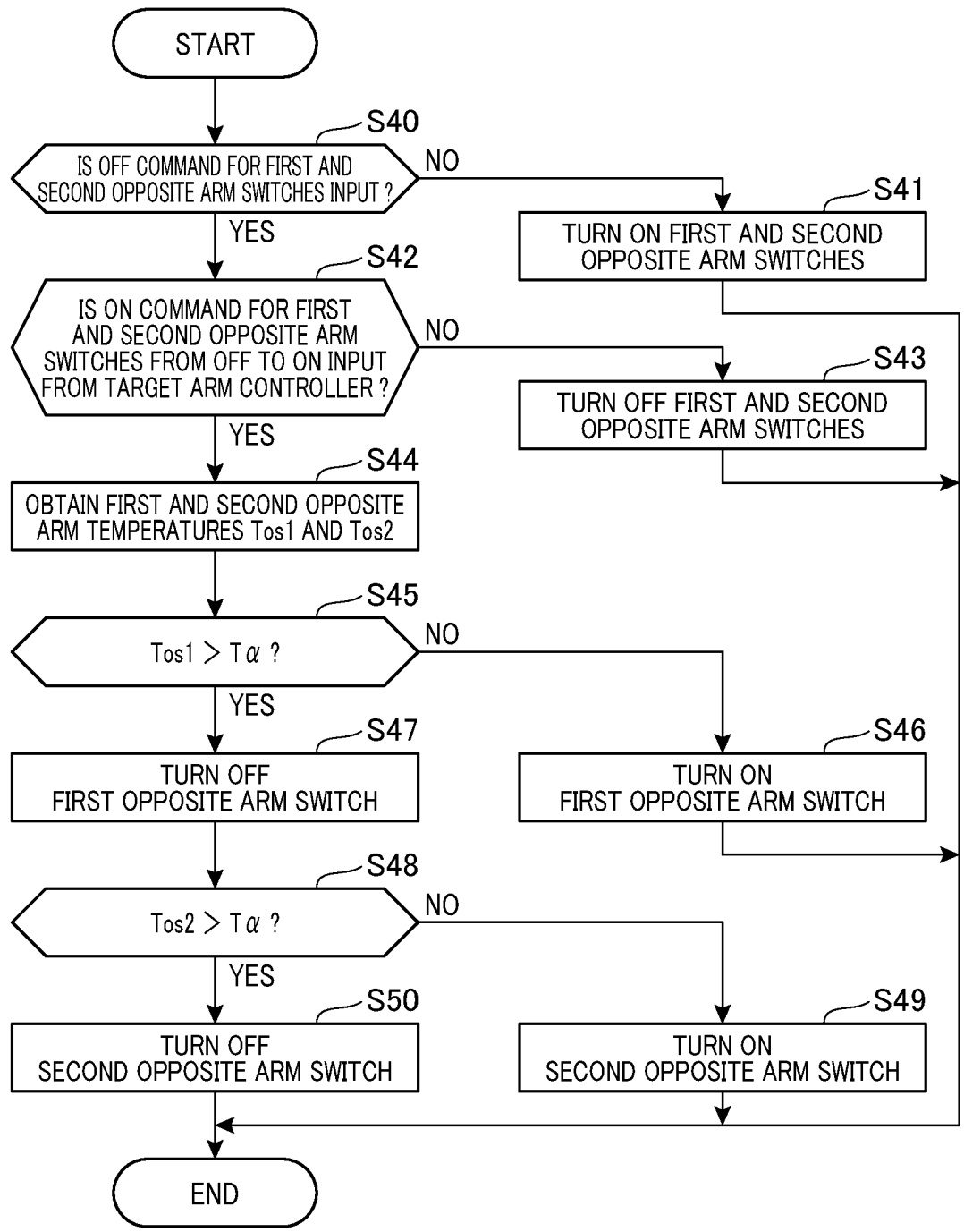
FIG. 16 is a flowchart schematically illustrating an opposite-arm switch driving routine according to the fifth embodiment of the present disclosure.

The following describes an opposite-arm switch driving routine carried out by the opposite arm controller with reference to FIG. 16. The opposite arm controller is configured to perform the opposite-arm switch driving routine every predetermined control period.

When starting the opposite-arm switch driving routine, the opposite arm controller determines whether the off command for the first and second opposite arm switches has been input thereto in step S40. Upon determining that the off command for the first and second opposite arm switches is not input thereto (NO in step S40), the opposite arm controller determines that the on command has been input thereto, and performs the charging task for the first and second opposite arm switches to thereby turn on the corresponding one of the first and second opposite arm switches in step S41.

Otherwise, upon determining that the off command for the first and second opposite arm switches has been input thereto (YES in step S40), the opposite arm controller determines whether the on command for switching the first and second opposite arm switches from the off state to the on state has been input thereto from the target arm controller in step S42. Upon determining that the on command for switching the first and second opposite arm switches from the off state to the on state is not input thereto from the target arm controller (NO in step S42), the opposite arm controller performs the discharging task for the first and second opposite arm switches to thereby turn off the corresponding one of the first and second opposite arm switches in step S43.

Otherwise, upon determining that the on command for switching the first and second opposite arm switches from the off state to the on state has been input thereto from the target arm controller (YES in step S42), the opposite arm controller obtains a first opposite arm temperature Tos1 indicative of the temperature of the first opposite arm switch, and a second opposite arm temperature Tos2 indicative of the temperature of the second opposite arm switch in step S44.

Following the operation in step S44, the opposite arm controller determines whether the first opposite arm temperature Tos1 has exceeded a temperature threshold Tα in step S45. The operation in step S45 aims to determine whether an overheating failure has occurred in the first opposite arm switch.

Upon determining that the first opposite arm temperature Tos1 has not exceeded the temperature threshold Tα (NO in step S45), the opposite arm controller performs the charging task for the first opposite arm switch to thereby turn on the first opposite arm switch independently of the off command being input thereto in step S46.

Otherwise, upon determining that the first opposite arm temperature Tos1 has exceeded the temperature threshold Tα (YES in step S45), the opposite arm controller performs the discharging task for the opposite arm switch to thereby turn off or maintain off the first opposite arm switch in step S47.

Following the operation in step S46 or S47, the opposite arm controller determines whether the second opposite arm temperature Tos2 has exceeded the temperature threshold Tα in step S48. The operation in step S48 aims to determine whether an overheating failure has occurred in the second opposite arm switch.

Upon determining that the second opposite arm temperature Tos2 has not exceeded the temperature threshold Tα (NO in step S48), the opposite arm controller performs the charging task for the second opposite arm switch to thereby turn on the second opposite arm switch independently of the off command being input thereto in step S49.

Otherwise, upon determining that the second opposite arm temperature Tos2 has exceeded the temperature threshold Tα (YES in step S48), the opposite arm controller performs the discharging task for the opposite arm switch to thereby turn off or maintain off the second opposite arm switch in step S50.

After the operation in step S49 or S50, the opposite arm controller terminates the target-arm switch driving routine.

The operations in steps S44 to S50 serve as, for example, the protective driver.

As described above, one of the upper-arm drive circuit DrCH and the lower-arm drive circuit DrCL is configured to turn off the first and second target arm switches, and the other thereof is configured to turn on at least one of the first and second opposite arm switches when an overcurrent failure has occurred in at least one of the first and second target arm switches.

This configuration causes the on resistance of the at least one of the first and second opposite arm switches to be lower than the resistance across each of the opposite arm didoes. This enables a current to more concentrically flow through the on-state opposite arm switch other than the off-state opposite-arm switch and the first and second opposite arm diodes. This therefore results in reduction of the amount of heat generated from each of the first and second opposite arm switches, thus preventing a reduction in the reliability of each of the first and second opposite arm switches due to flow of a flyback current through its intrinsic diode.

In addition, one of the upper-arm drive circuit DrCH and the lower-arm drive circuit DrCL is configured to turn off the first and second target arm switches, and the other thereof is configured to turn on at least one of the first and second opposite arm switches when an overcurrent failure has occurred in at least one of the first and second target arm switches; the temperature of the at least one of the first and second opposite arm switches is equal to or lower than the threshold temperature Tα. In other words, the other of the upper-arm drive circuit DrCH and the lower-arm drive circuit DrCL prevents at least one of the first and second opposite arm switches from being turned on when the temperature of the at least one of the first and second opposite arm switches is higher than the threshold temperature Tα.

This configuration therefore prevents at least one of the first and second opposite arm switches, whose temperature is higher than the threshold temperature Tα, from being turned on, thus preventing an overheating failure from occurring in the at least one of the first and second opposite arm switches. This therefore prevents a reduction in the reliability of the first and second opposite arm switches.

As a first modification of the fifth embodiment, the target arm controller can be configured to send, to the opposite arm controller, the on command for switching the first and second opposite arm switches from the off state to the on state at a timing when a deadtime has elapsed since start of the discharging task of the first and second target arm switches. In this first modification, the deadtime can be set to be longer than a larger one of the following first and second periods:

The first period is defined as a period for which the gate voltage Vgs of the first target arm switch has lowered to reach the corresponding threshold voltage Vth since start of the discharging task for the first target arm switch The second period is defined as a period for which the gate voltage Vgs of the second target arm switch has lowered to reach the corresponding threshold voltage Vth since start of the discharging task for the second target arm switch As a second modification of the fifth embodiment, the target arm controller can be configured to determine whether the gate voltage Vgs of each of the first and second target arm switches has lowered below a predetermined voltage in step S36. The predetermined voltage is set to a value of the gate voltage Vgs; the value of the gate voltage Vge corresponds to a predetermined amount of a flyback current flowing through each of the first and second opposite arm switches. The predetermined amount of the flyback current flowing through each of the first and second opposite arm switches causes the amount of heat generated from the corresponding first and second opposite arm switches to exceed an allowable upper limit.

As a third modification of the fifth embodiment, the upper-arm drive circuit DrCH can be configured to individually turn on the first and second upper-arm switches SH1 and SH2 at respectively different timings, and the lower-arm drive circuit DrCL can also be configured to individually turn on the first and second lower-arm switches SL1 and SL2 at respectively different timings.

This configuration enables only one of the first and second target switches to be in the on state. While only one of the first and second target switches to be in the on state, the gate voltage Vgs of the other of the first and second target switches may fluctuate due to any cause, so that the determination in step S36 can be affirmative. This therefore enables the target-arm switch driving routine illustrated in FIG. 15 to be carried out.

Sixth Embodiment

Figure 17:
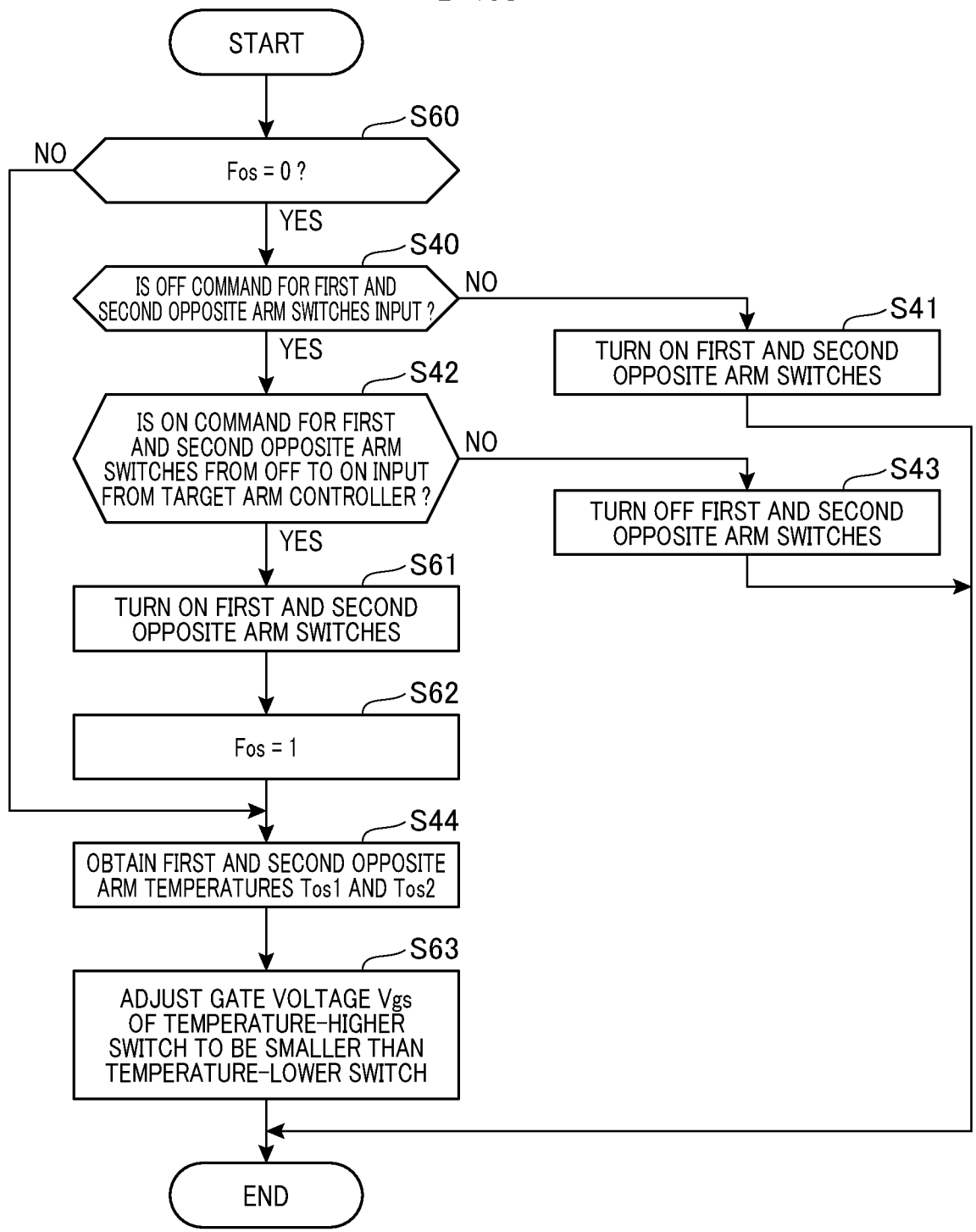
FIG. 17 is a flowchart schematically illustrating an opposite-arm switch driving routine according to the sixth embodiment of the present disclosure.

The following describes the sixth embodiment of the present disclosure with reference to FIG. 17. The sixth embodiment is different from the fifth embodiment by the following points. So, the following mainly describes the different points, and omits or simplifies descriptions of like parts between the fifth and sixth embodiments, to which identical or like reference characters are assigned, thus eliminating redundant description.

The opposite arm controller of the sixth embodiment is configured to (1) Increase the gate voltage Vgs of one of the first and second opposite arm switches having the temperature lower than the temperature of the other of the first and second opposite arm switches and/or (2) Decrease the gate voltage Vgs of the other of the first and second opposite arm switches having the temperature higher than the temperature of one of the first and second opposite arm switches This configuration enables the temperatures of the first and second opposite arm switches to balance with each other.

The following describes an opposite-arm switch driving routine carried out by the opposite arm controller according to the sixth embodiment with reference to FIG. 17. The opposite arm controller is configured to perform the opposite-arm switch driving routine every predetermined control period. Like steps between the opposite-arm switch driving routine illustrated in FIG. 17 and the opposite-arm switch driving routine illustrated in FIG. 16, to which like step numbers are assigned, are omitted or simplified in description.

When starting the opposite-arm switch driving routine, the opposite arm controller determines whether a command determination flag Fos is set to 0 in step S60. Note that the command determination flag Fos is previously prepared in each of the controllers 40 and 50, and the command determination flag Fos being set to 1 represents that the on command for the first and second opposite arm switches has been input thereto from the target arm controller, and the command determination flag Fos being set to 0 represents that the on command for the first and second opposite arm switches is not input thereto from the target arm controller. The command determination flag Fos is set to an initial value of 0.

Upon determining that the command determination flag Fos is set to 0 (YES in step S60), the opposite arm controller performs the determination in step S40 set forth above.

Upon determining that each of the determinations in steps S40 and S42 is affirmative, the opposite arm controller performs the charging task for the first and second opposite arm switches to thereby turn on the corresponding one of the first and second opposite arm switches in step S61.

Following the operation in step S61, the opposite arm controller sets the command determination flag to 1 in step S62.

After completion of the operation in step S62 or after determination that the command determination flag Fos is set to 1 (NO in step S60), the opposite-arm switch drive routine proceeds to step S44. In step S44, the opposite arm controller obtains the first opposite arm temperature Tos1 and the second opposite arm temperature Tos2 in step S44.

Following the operation in step S44, the opposite arm controller adjusts the gate voltage Vgs of each of the first and second opposite arm switches such that the gate voltage Vgs of one of the first and second opposite arm switches, which has the higher arm temperature, is lower than the gate voltage Vgs of the other of the first and second opposite arm switches, which has the lower arm temperature while maintaining the gate voltage Vgs of each of the first and second opposite arm switches to be higher than the corresponding threshold voltage Vth in step S63. The operations in steps S61, S62, S44, and S63 serve as, for example, the protective driver.

This configuration enables a decrease in the drain current based on the decrease in the gate voltage Vge of one of the first and second opposite arm switches to be greater than an increase in the on resistance thereof based on the decrease in the gate voltage Vge, resulting in a reduction of the amount of heat generated from one of the first and second opposite arm switches.

This configuration also enables an increase in the drain current based on the increase in the gate voltage Vge of the other of the first and second opposite arm switches to be greater than a decrease in the on resistance thereof based on the increase in the gate voltage Vge, resulting in an increase in the amount of heat generated from the other of the first and second opposite arm switches.

This therefore makes it possible to balance the temperatures of the first and second opposite arm switches with each other in addition to the same benefits as those achieved by the fifth embodiment.

Seventh Embodiment

Figure 18:
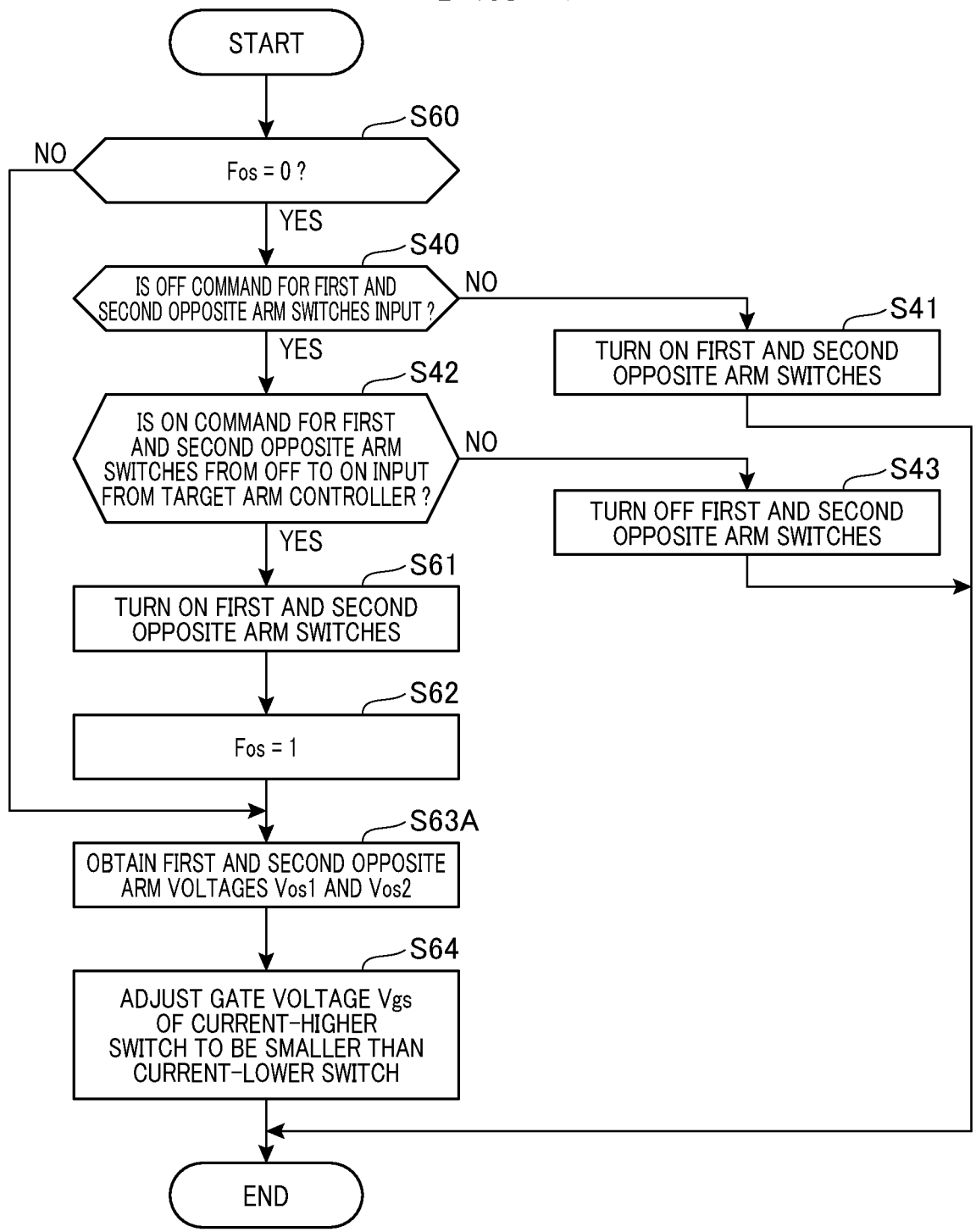
FIG. 18 is a flowchart schematically illustrating an opposite-arm switch driving routine according to the seventh embodiment of the present disclosure.

The following describes the seventh embodiment of the present disclosure with reference to FIG. 18. The seventh embodiment is different from the sixth embodiment by the following points. So, the following mainly describes the different points, and omits or simplifies descriptions of like parts between the sixth and seventh embodiments, to which identical or like reference characters are assigned, thus eliminating redundant description.

The opposite arm controller of the seventh embodiment is configured to (1) Increase the gate voltage Vgs of one of the first and second opposite arm switches having the drain current lower than the drain current of the other of the first and second opposite arm switches and/or (2) Decrease the gate voltage Vgs of the other of the first and second opposite arm switches having the drain current higher than the drain current of one of the first and second opposite arm switches This configuration enables the magnitudes of the drain currents flowing through the respective first and second opposite arm switches to balance with each other, thus enabling the temperatures of the first and second opposite arm switches to balance with each other.

The following describes an opposite-arm switch driving routine carried out by the opposite arm controller according to the seventh embodiment with reference to FIG. 18. The opposite arm controller is configured to perform the opposite-arm switch driving routine every predetermined control period. Like steps between the opposite-arm switch driving routine illustrated in FIG. 18 and the opposite-arm switch driving routine illustrated in FIG. 17, to which like step numbers are assigned, are omitted or simplified in description.

After completion of the operation in step S62 or after determination that the command determination flag Fos is set to 1 (NO in step S60), the opposite-arm switch drive routine proceeds to step S63A.

In step S63A, the opposite arm controller obtains the first and second opposite arm voltages Vos1 and Vos2.

Following the operation in step S63A, the opposite arm controller adjusts the gate voltage Vgs of each of the first and second opposite arm switches such that the gate voltage Vgs of one of the first and second opposite arm switches, which has the higher drain current, is lower than the gate voltage Vgs of the other of the first and second opposite arm switches, which has the lower drain current while maintaining the gate voltage Vgs of each of the first and second opposite arm switches to be higher than the corresponding threshold voltage Vth in step S64. The operations in steps S61, S62, S63A, and S64 serve as, for example, the protective driver.

This configuration enables a decrease in the drain current based on the decrease in the gate voltage Vge of one of the first and second opposite arm switches to be greater than an increase in the on resistance thereof based on the decrease in the gate voltage Vge, resulting in a reduction of the amount of heat generated from one of the first and second opposite arm switches.

This configuration also enables an increase in the drain current based on the increase in the gate voltage Vge of the other of the first and second opposite arm switches to be greater than a decrease in the on resistance thereof based on the increase in the gate voltage Vge, resulting in an increase in the amount of heat generated from the other of the first and second opposite arm switches.

This therefore makes it possible to balance the temperatures of the first and second opposite arm switches with each other in addition to the same benefits as those achieved by the fifth embodiment.

Eighth Embodiment

Figure 19:
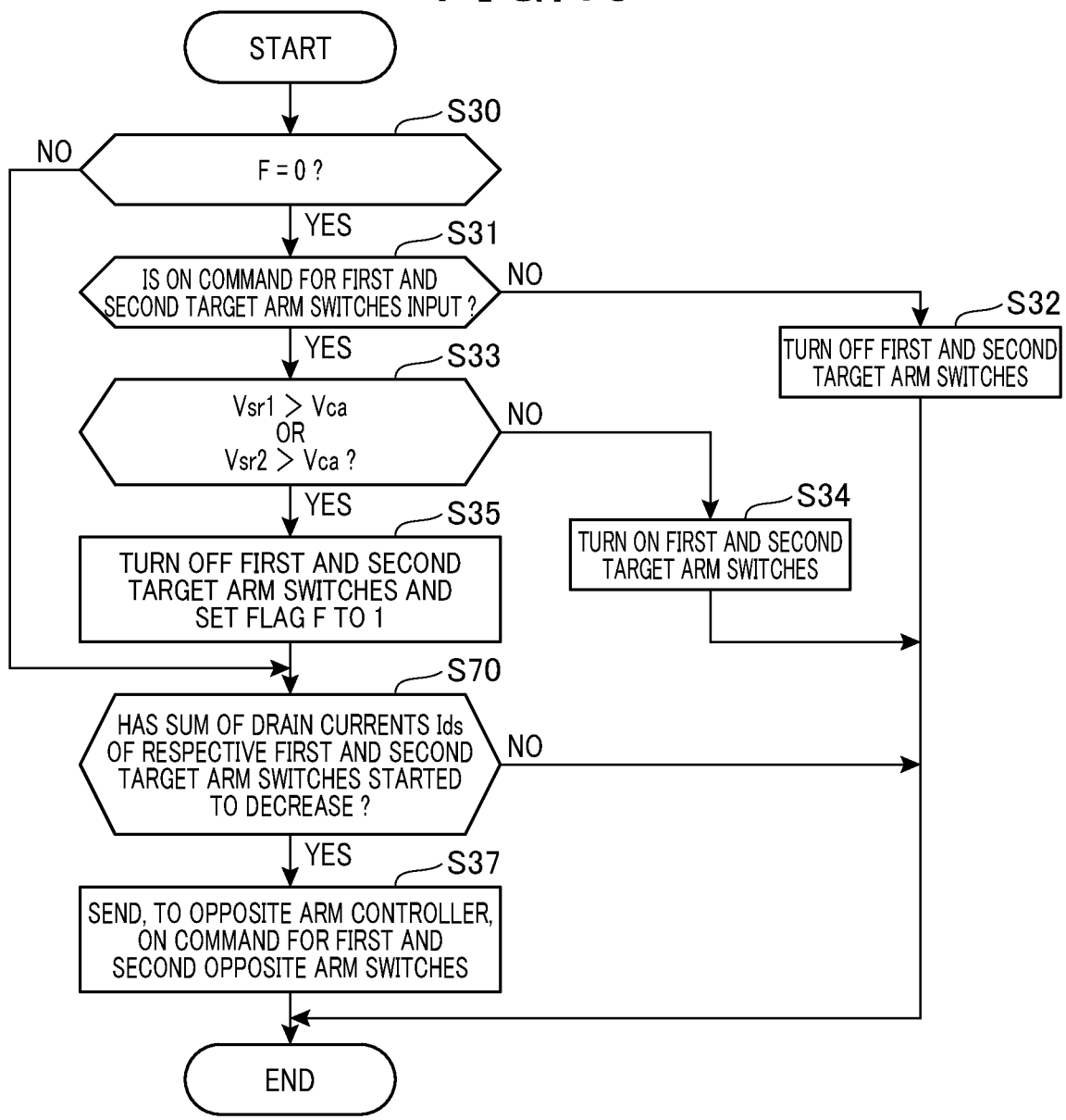
FIG. 19 is a flowchart schematically illustrating a target-arm switch driving routine according to the eighth embodiment of the present disclosure.

The following describes the eighth embodiment of the present disclosure with reference to FIG. 19. The eighth embodiment is different from the sixth embodiment by the following points. So, the following mainly describes the different points, and omits or simplifies descriptions of like parts between the sixth and eighth embodiments, to which identical or like reference characters are assigned, thus eliminating redundant description.

The target arm controller of the eighth embodiment is configured to instruct the opposite arm controller to switch each of the first and second opposite-arm switches from the off state to the on state when determining that the sum of the drain currents flowing through the respective first and second target switches has started to decrease. This configuration uses the fact that, when the gate voltage Vgs of each of the first and second target switches has lowered below the corresponding threshold voltage Vth, the sum of the drain currents flowing through the respective first and second target arm switches has started to decrease.

The following describes a target-arm switch driving routine carried out by the target arm controller according to the eighth embodiment with reference to FIG. 19. The target arm controller is configured to perform the target-arm switch driving routine every predetermined control period. Like steps between the target-arm switch driving routine illustrated in FIG. 19 and the target-arm switch driving routine illustrated in FIG. 15, to which like step numbers are assigned, are omitted or simplified in description.

After completion of the operation in step S35 or when the negative determination in step S30 is performed, the target-arm switch driving routine proceeds to step S70.

In step S70, the target arm controller serves as, for example, the protective driver to determine, based on the first and second opposite arm voltages Vos1 and Vos2, whether the sum of the drain currents flowing through the respective first and second target switches has started to decrease.

Upon it being determined that the sum of the drain currents flowing through the respective first and second target switches has started to decrease (YES in step S70), the target-arm switch driving routine proceeds to step S37. Otherwise, upon it being determined that the sum of the drain currents flowing through the respective first and second target switches has not started to decrease (NO in step S70), the target arm controller terminates the target-arm switch driving routine.

Note that the target arm controller can determine, based on the phase currents measured by the phase current sensor 23, whether the sum of the drain currents flowing through the respective first and second target switches has started to decrease.

The eighth embodiment achieves the benefits as those achieved by the sixth embodiment.

As a modification of the eighth embodiment, the upper-arm drive circuit DrCH can be configured to individually turn on the first and second upper-arm switches SH1 and SH2 at respectively different timings, and the lower-arm drive circuit DrCL can also be configured to individually turn on the first and second lower-arm switches SL1 and SL2 at respectively different timings. That is, the target arm controller of this modification can be configured to perform the target-arm switch driving routine illustrated in FIG. 19.

Ninth Embodiment

Figure 20:
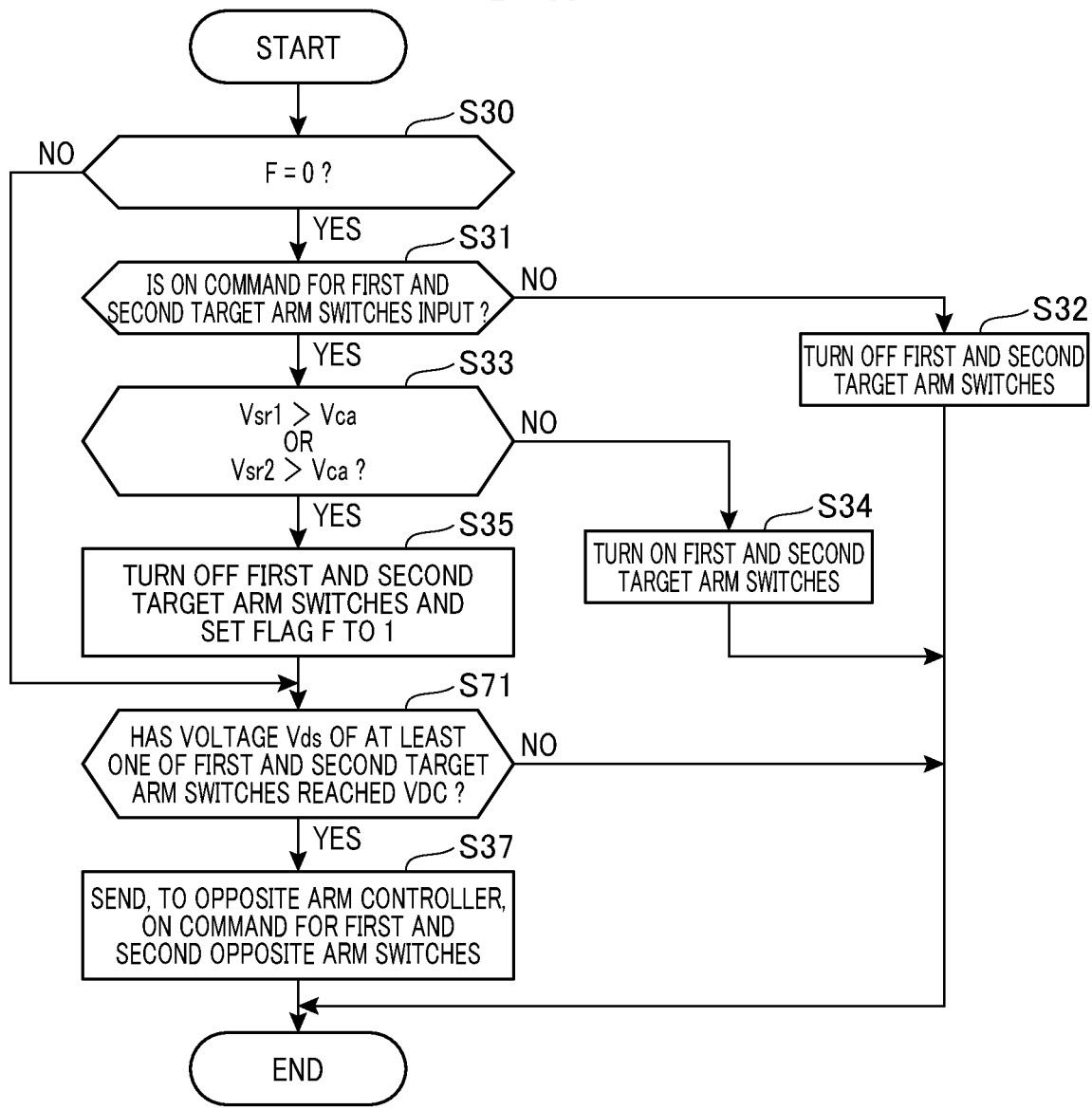
FIG. 20 is a flowchart schematically illustrating a target-arm switch driving routine according to the ninth embodiment of the present disclosure.

The following describes the ninth embodiment of the present disclosure with reference to FIG. 20. The ninth embodiment is different from the eighth embodiment by the following points. So, the following mainly describes the different points, and omits or simplifies descriptions of like parts between the eighth and ninth embodiments, to which identical or like reference characters are assigned, thus eliminating redundant description.

The target arm controller of the ninth embodiment is configured to instruct the opposite arm controller to switch each of the first and second opposite-arm switches from the off state to the on state when determining that the terminal voltage, i.e. the drain-source voltage, Vds of each of the first and second target arm switches has reached the power supply voltage VDC. This configuration uses the fact that, when the first and second upper-arm switches SH1 and SH2 are tuned off while the first and second lower-arm switches SL1 and SL2 are kept in the off state, the terminal voltage, i.e. the drain-source voltage, Vds of each of the first and second target arm switches becomes equal to the power supply voltage VDC.

The following describes a target-arm switch driving routine carried out by the target arm controller according to the ninth embodiment with reference to FIG. 20. The target arm controller is configured to perform the target-arm switch driving routine every predetermined control period. Like steps between the target-arm switch driving routine illustrated in FIG. 20 and the target-arm switch driving routine illustrated in FIG. 19, to which like step numbers are assigned, are omitted or simplified in description.

After completion of the operation in step S35 or when the negative determination in step S30 is performed, the target-arm switch driving routine proceeds to step S71.

In step S71, the target arm controller serves as, for example, the protective driver to obtain the terminal voltage Vds of each of the first and second target arm switches, and also obtain the power supply voltage VDC. Then, in step S71, the target arm controller serves as, for example, the protective driver to determine whether the terminal voltage Vds of at least one of the first and second target arm switches has increased to reach the power supply voltage VDC.

Upon it being determined that the terminal voltage Vds of at least one of the first and second target arm switches has increased to reach the power supply voltage VDC (YES in step S71), the target-arm switch driving routine proceeds to step S37. Otherwise, upon it being determined that the terminal voltage Vds of each of the first and second target arm switches has not increased to reach the power supply voltage VDC yet (NO in step S71), the target arm controller terminates the target-arm switch driving routine.

The ninth embodiment achieves the benefits as those achieved by the eighth embodiment.

As a modification of the ninth embodiment, the upper-arm drive circuit DrCH can be configured to individually turn on the first and second upper-arm switches SH1 and SH2 at respectively different timings, and the lower-arm drive circuit DrCL can also be configured to individually turn on the first and second lower-arm switches SL1 and SL2 at respectively different timings.

This configuration enables only one of the first and second target switches to be in the on state. While only one of the first and second target switches to be in the on state, the terminal voltage Vds of the other of the first and second target switches is capable of having reached the power supply voltage VDC, making it possible to perform the target-arm switch driving routine illustrated in FIG. 20.

Tenth Embodiment

Figure 21:
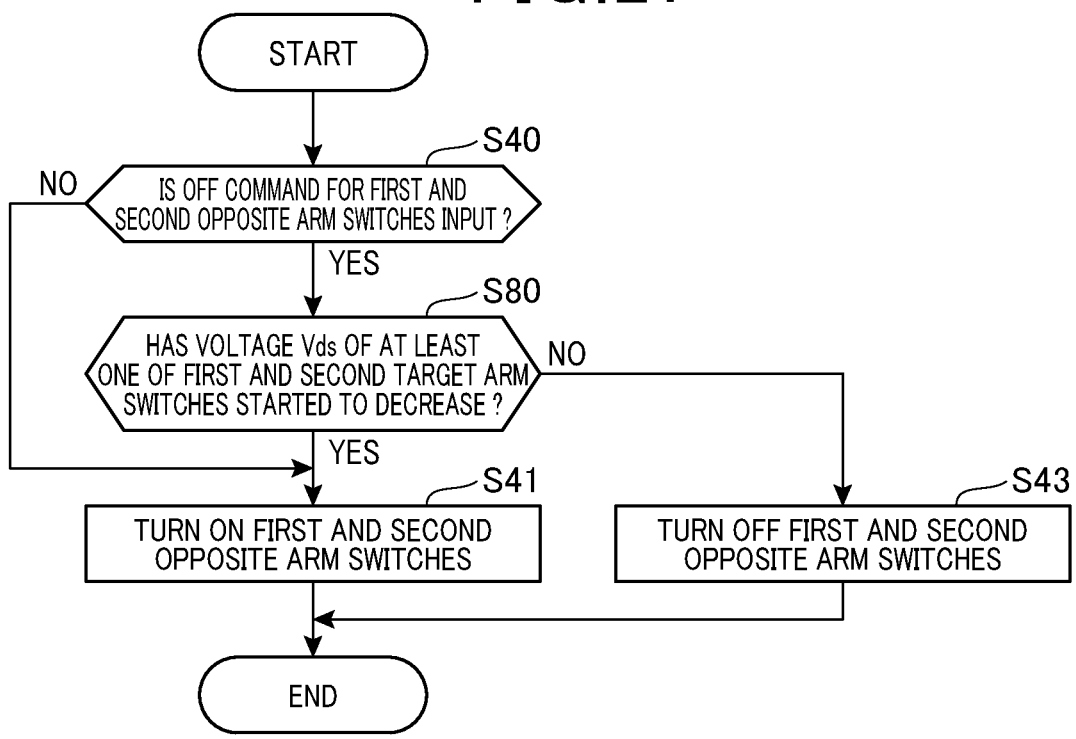
FIG. 21 is a flowchart schematically illustrating an opposite-arm switch driving routine according to the tenth embodiment of the present disclosure.

The following describes the tenth embodiment of the present disclosure with reference to FIG. 21. The tenth embodiment is different from the fifth embodiment by the following points. So, the following mainly describes the different points, and omits or simplifies descriptions of like parts between the fifth and tenth embodiments, to which identical or like reference characters are assigned, thus eliminating redundant description.

The opposite arm controller of the tenth embodiment is configured to turn on the first and second opposite arm switches upon determining that the terminal voltage Vds of at least one of the first and second opposite arm switches has started to decrease.

That is, when a flyback current has started to flow through at least one of the first and second target arm switches, the terminal voltage Vds of the corresponding at least one of the first and second target switches has started to decrease. From this viewpoint, the opposite arm controller of the tenth embodiment is capable of recognizing the occurrence of an overcurrent failure in at least one of the first and second target switches upon determining that the terminal voltage Vds of the corresponding at least one of the first and second target switches has started to decrease. This therefore enables a signal line between the upper- and lower-arm drive controllers 40 and 50 for transferring the on command from the target arm controller to the opposite arm controller to be eliminated.

Note that the target-arm switch driving routine carried out by the target arm controller according to the tenth embodiment is configured such that the operations in steps S36 and S37 have been eliminated from the target-arm switch driving routine illustrated in FIG. 15.

The following describes an opposite-arm switch driving routine carried out by the opposite arm controller with reference to FIG. 21. The opposite arm controller is configured to perform the opposite-arm switch driving routine every predetermined control period. Like steps between the opposite-arm switch driving routine illustrated in FIG. 21 and the opposite-arm switch driving routine illustrated in FIG. 16, to which like step numbers are assigned, are omitted or simplified in description.

Upon determining that the off command for the first and second opposite arm switches has been input thereto (YES in step S40), the opposite arm controller serves as, for example, the protective driver to determine whether the terminal voltage Vds of at least one of the first and second target voltages has started to decrease in step S80.

Upon determining that the terminal voltage Vds of at least one of the first and second target voltages has not started to decrease (NO in step S80), the opposite arm controller performs the discharging task for the first and second opposite arm switches to thereby turn off the corresponding one of the first and second opposite arm switches in step S43.

Otherwise, upon determining that the terminal voltage Vds of at least one of the first and second target voltages has started to decrease (YES in step S80), the opposite arm controller serves as, for example, the protective driver to perform the charging task for the first and second opposite arm switches to thereby turn on the corresponding one of the first and second opposite arm switches in step S41.

This configuration enables a signal line between the upper- and lower-arm drive controllers 40 and 50 for transferring the on command from the target arm controller to the opposite arm controller to be eliminated.

As a modification of the tenth embodiment, the upper-arm drive circuit DrCH can be configured to individually turn on the first and second upper-arm switches SH1 and SH2 at respectively different timings, and the lower-arm drive circuit DrCL can also be configured to individually turn on the first and second lower-arm switches SL1 and SL2 at respectively different timings. That is, the target arm controller of this modification can be configured to perform the target-arm switch driving routine illustrated in FIG. 21.

Eleventh Embodiment

Figure 22:
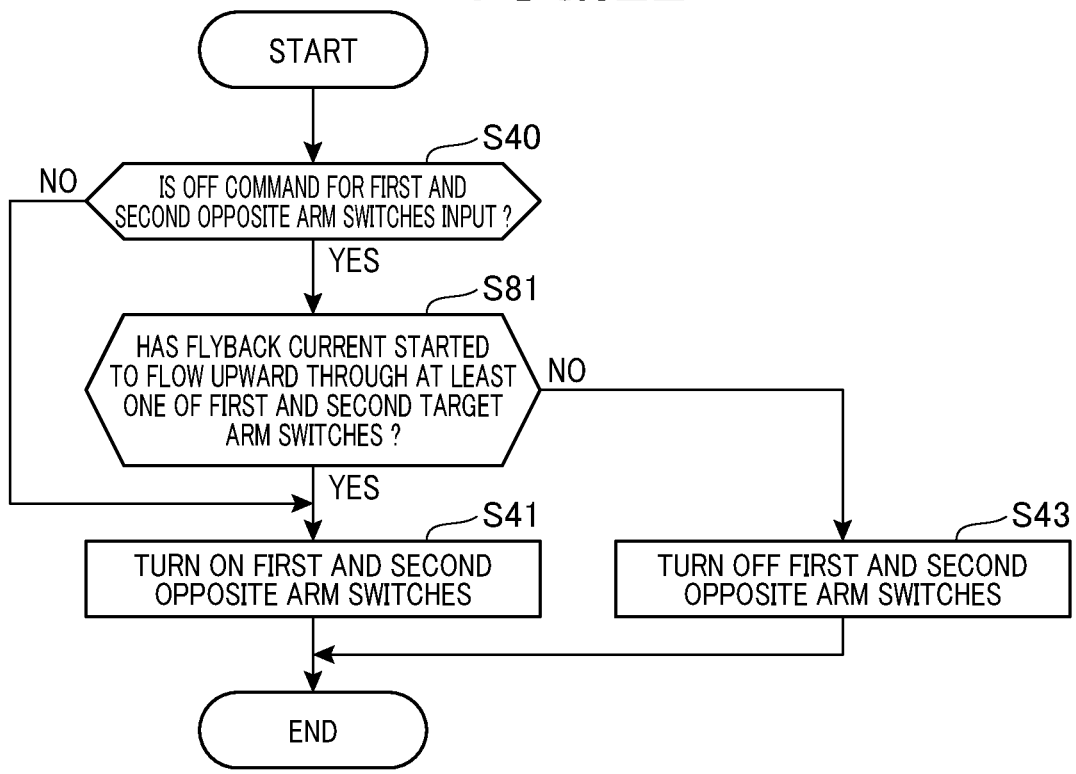
FIG. 22 is a flowchart schematically illustrating an opposite-arm switch driving routine according to the eleventh embodiment of the present disclosure.

The following describes the eleventh embodiment of the present disclosure with reference to FIG. 22. The eleventh embodiment is different from the tenth embodiment by the following points. So, the following mainly describes the different points, and omits or simplifies descriptions of like parts between the tenth and eleventh embodiments, to which identical or like reference characters are assigned, thus eliminating redundant description.

The opposite arm controller of the tenth embodiment is configured to turn on the first and second opposite arm switches upon determining that a flyback current has started to flow upward through at least one of the first and second opposite arm switches.

The following describes an opposite-arm switch driving routine carried out by the opposite arm controller with reference to FIG. 22. The opposite arm controller is configured to perform the opposite-arm switch driving routine every predetermined control period. Like steps between the opposite-arm switch driving routine illustrated in FIG. 22 and the opposite-arm switch driving routine illustrated in FIG. 21, to which like step numbers are assigned, are omitted or simplified in description.

Upon determining that the off command for the first and second opposite arm switches has been input thereto (YES in step S40), the opposite arm controller serves as, for example, the protective driver to determine, based on the first and second opposite arm voltages Vos1 and Vos2, whether a flyback current has started to flow upward through at least one of the first and second opposite arm switches in step S81.

Upon determining that a flyback current has not started to flow upward through at least one of the first and second opposite arm switches (NO in step S81), the opposite arm controller performs the discharging task for the first and second opposite arm switches to thereby turn off the corresponding one of the first and second opposite arm switches in step S43.

Otherwise, upon determining that a flyback current has started to flow upward through at least one of the first and second opposite arm switches (YES in step S81), the opposite arm controller serves as, for example, the protective driver to perform the charging task for the first and second opposite arm switches to thereby turn on the corresponding one of the first and second opposite arm switches in step S41.

This configuration enables a signal line between the upper- and lower-arm drive controllers 40 and 50 for transferring the on command from the target arm controller to the opposite arm controller to be eliminated.

As a modification of the tenth embodiment, the upper-arm drive circuit DrCH can be configured to individually turn on the first and second upper-arm switches SH1 and SH2 at respectively different timings, and the lower-arm drive circuit DrCL can also be configured to individually turn on the first and second lower-arm switches SL1 and SL2 at respectively different timings. That is, the target arm controller of this modification can be configured to perform the target-arm switch driving routine illustrated in FIG. 22.

Twelfth Embodiment

Figure 23:
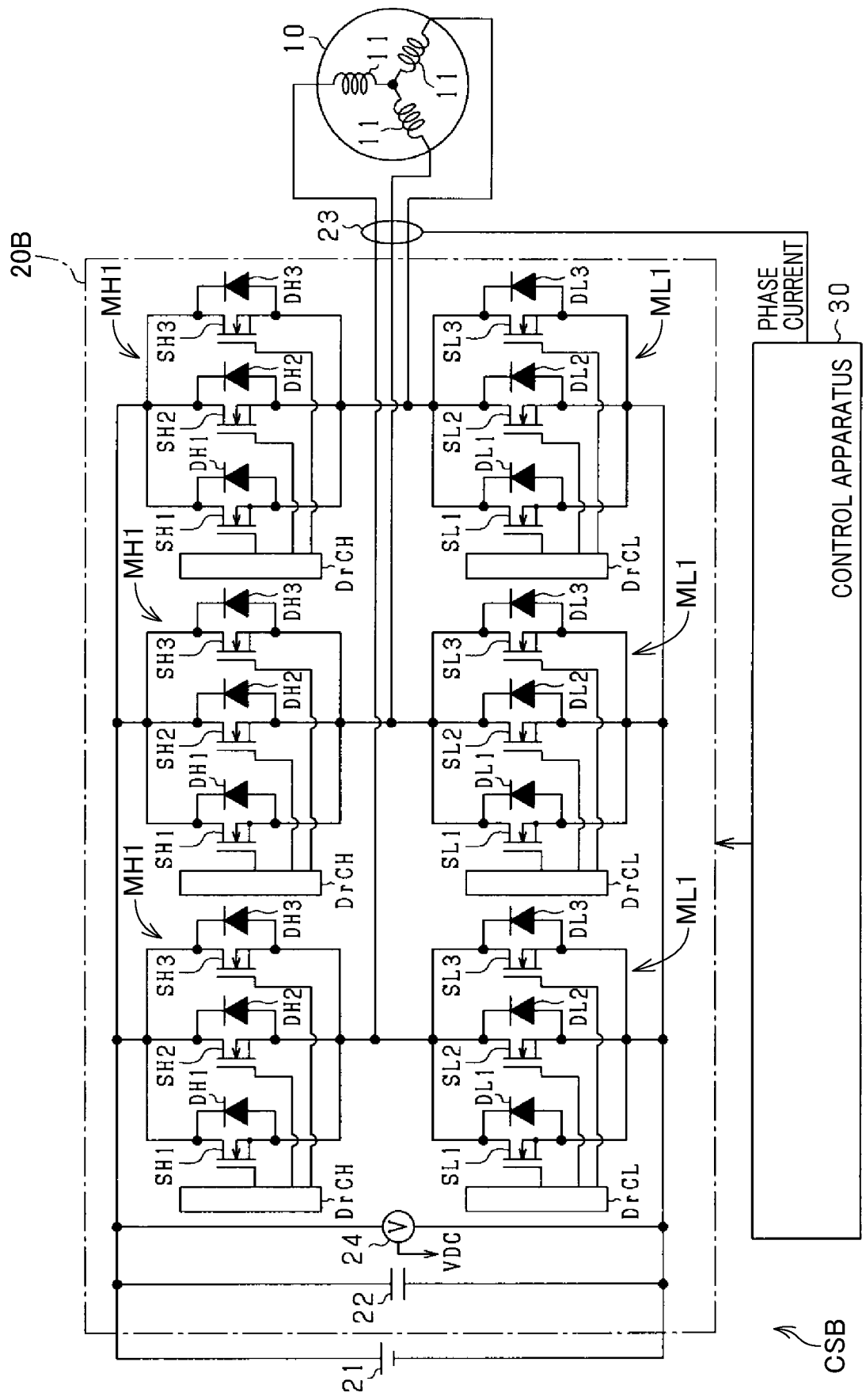
FIG. 23 is a circuit diagram schematically illustrating an example of the overall structure of a control system for a rotary electric machine according to the twelfth embodiment of the present disclosure.
Figure 24:
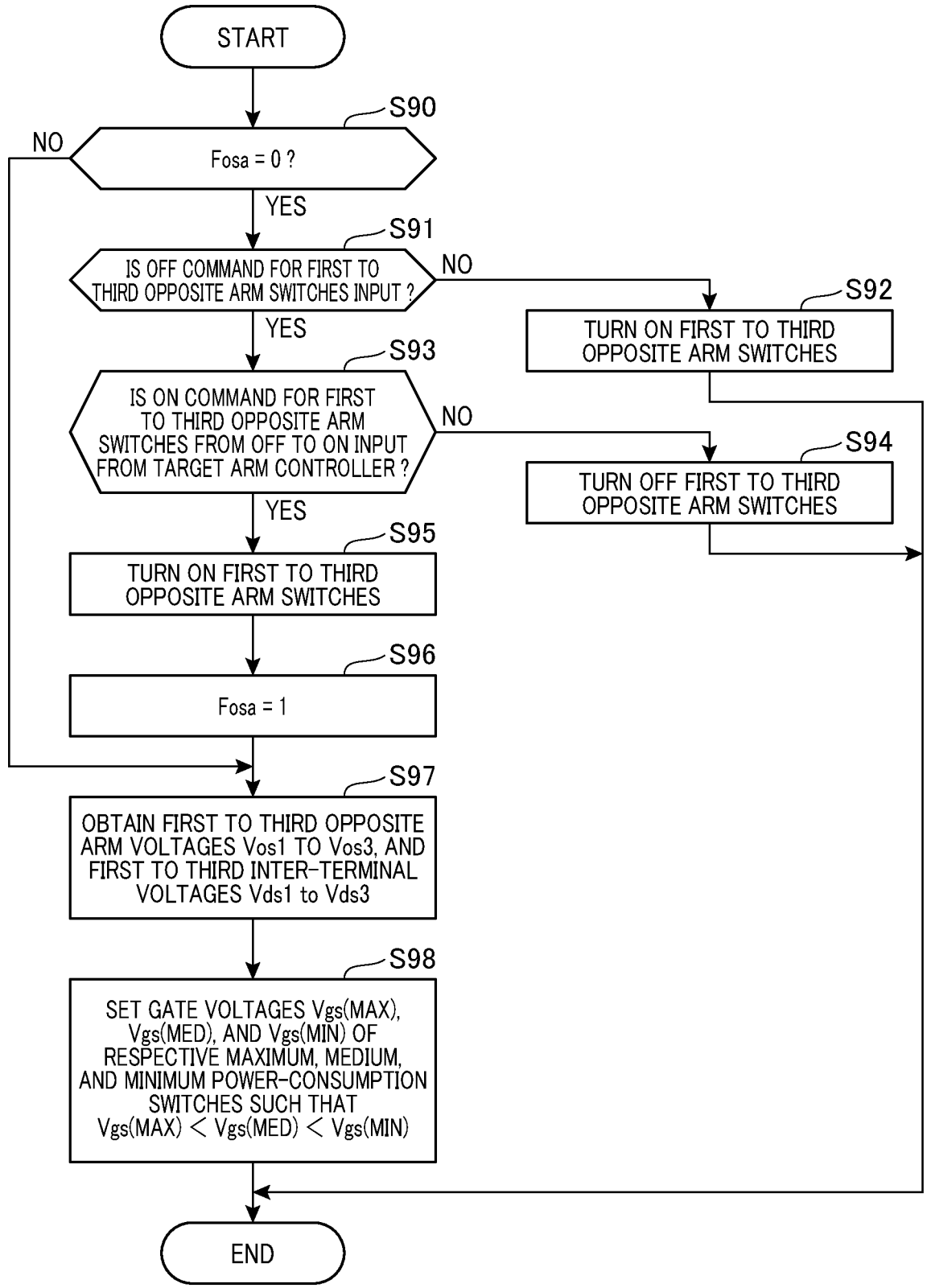
FIG. 24 is a flowchart schematically illustrating an opposite-arm switch driving routine according to the twelfth embodiment of the present disclosure.

The following describes the twelfth embodiment of the present disclosure with reference to FIGS. 23 and 24. The twelfth embodiment is different from the sixth or seventh embodiment by the following points. So, the following mainly describes the different points, and omits or simplifies descriptions of like parts between the sixth or seventh embodiment and the twelfth embodiment, to which identical or like reference characters are assigned, thus eliminating redundant description.

A drive circuit according to the twelfth embodiment is embodied as a component of a control system CSB for controlling the rotary electric machine 10.

The control system CSB includes an inverter 20B.

The inverter 20B includes three (UVW)-phase switch members for the respective three-phase of the rotary electric machine 10.

The switch member for each phase is comprised of first, second, and third upper-arm switches SH1, SH2, and SH3 parallely connected to each other, and first, second, and third lower-arm switches SL1, SL2, and SL3 parallely connected to each other. For each phase, the upper-arm assembly MH1 of the upper-arm switches SH1, SH2, and SH3 and the lower-arm assembly ML1 of the lower-arm switches SL1, S12, and SL3 are connected in series to each other.

The twelfth embodiment uses, as each of the upper- and lower-arm switches SH1, SH2, SH3, SL1, SL2, and SL3, an N-channel MOSFET, which is a unipolar, wide-bandgap semiconductor switch, such as a silicon carbide (SiC) switch or a Gallium nitride (GaN) switch.

The first to third upper-arm switches SH1 to SH3 for each phase have the same structure, and the first to third lower-arm switches SL1 to SL3 for each phase have the same structure.

Each of the first to third upper-arm switches SH1 to SH3 for each phase incorporates, as its intrinsic diode, a corresponding one of first to third upper-arm diodes DH1 to DH3. Similarly, each of the first to third lower-arm switches SL1 to SL3 for each phase incorporates, as its intrinsic diode, a corresponding one of first to third lower-arm diodes DL1 to DL3.

The anode of each of the first to third upper-arm diodes DH1 to DH3 is connected to the source of the corresponding one of the switches SH1 to SH3, and the cathode of each of the first to third upper-arm diodes DH1 to DH3 is connected to the drain of the corresponding one of the switches SH1 to SH3. Similarly, the anode of each of the first to third lower-arm diodes DL1 to DL3 is connected to the source of the corresponding one of the switches SL1 to SL3, and the cathode of each of the first to third lower-arm diodes DL1 to DL3 is connected to the drain of the corresponding one of the switches SL1 to SL3.

The connection point between the upper-arm assembly MH1 and the lower-arm assembly ML1 for each phase is connected to the first end of the corresponding one of the three-phase stator coils 11.

The upper-arm drive circuits DrCH are provided for the respective upper-arm assemblies MH1 and connected to the control terminals, such as the gates, of the respective first to third upper-arm switches SH1 to SH3. Similarly, the lower-arm drive circuits DrCL are provided for the respective lower-arm assemblies ML1 and connected to the control terminals, such as the gates, of the respective first to third lower-arm switches SL1 to SL3.

The control apparatus 30 is controllably connected to the upper-drive and lower-arm circuits DrCH and DrCL.

The control apparatus 30 is configured to control on-off switching operations of each of the first to third upper-arm switches SH1 to SH3 for each phase via the corresponding one of the upper-arm drive circuits DrCH, and on-off switching operation of each of the first to third lower-arm switches SL1 to SL3 via the corresponding one of the lower-arm drive circuits DrCL to thereby control the controlled variable, such as torque, of the rotary electric machine 10 to a commanded value or a requested value.

Specifically, the control apparatus 30 is configured to output, for each phase, (1) First to third upper-arm drive signals to the corresponding upper-arm drive circuit DrCH (2) First to third lower-arm drive signals to the corresponding lower-arm drive circuit DrCL This causes the upper- and lower-arm drive circuits DrCH and DrCL of each phase to alternately turn on the upper-arm assembly MH1 of the first to third upper-arm switches SH1 to SH3 and the lower-arm assembly ML1 of the first to third lower-arm switches SL1 to SL3 while ensuring deadtimes between (1) Turn-off timing of the upper-arm assembly MH1 of the switches SH1 to SH3 and turn-on timing of the lower-arm assembly ML1 of the switches SL1 to SL3

(2) Turn-on timing of the upper-arm assembly MH1 of the switches SH1 to SH3 and turn-off timing of the lower-arm assembly ML1 of the switches SL1 to SL3

The upper-arm drive circuit DrCH is configured to simultaneously perform the charging task for the first to third upper-aim switches SH1 to SH3 in response to the on command input thereto. In addition, the upper-arm drive circuit DrCH is configured to simultaneously perform the discharging task for the first to third upper-arm switches SH1 to SH3 in response to the off command input thereto.

Similarly, the lower-arm drive circuit DrCL is configured to simultaneously perform the charging task for the first to third lower-arm switches SL1 to SL3 in response to the on command input thereto. In addition, the lower-arm drive circuit DrCL is configured to simultaneously perform the discharging task for the first to third lower-arm switches SL1 to SL3 in response to the off command input thereto.

Next, the following describes each of the upper- and lower drive circuits DrCH and DrCL with reference to FIG. 14.

First, the following describes the upper-arm drive circuits DrCH.

Each upper-arm drive circuit DrCH includes an upper arm controller 40. The upper arm controller 40 is connected to the control apparatus 30, and receives the first to third upper-arm drive signals sent from the control apparatus 30.

The upper arm controller 40 determines whether each of the first to third upper-arm drive signals is the on-command, and performs the charging task upon determining that each of the first to third upper-arm drive signals is the on-command, thus turning on the first to third upper-arm switches SH1 to SH3.

Otherwise, the upper arm controller 40 performs the discharging task upon determining that each of the first to third upper-arm drive signals is the off-command, thus turning off the first to third upper-arm switches SH1 to SH3.

Like the first and second upper-arm sense voltages VsH1 and VsH2, the upper-arm controller 40 obtains a third upper-arm sense voltage VsH3 serving as, for example, an electric state parameter correlating with the magnitude of the drain current or the flyback current for the third upper-arm switch SH3. The upper-arm controller 40 also obtains the terminal voltage Vds of each of the first to third upper-arm switches SH1 to SH3. The terminal voltages Vds of the respective first to third upper-arm switches SH1 to SH3 will also be referred to as first to third terminal voltages Vds1 to Vds3.

Like the first and second upper-arm sense voltages VsH1 and VsH2, the lower-arm controller 50 obtains a third lower-arm sense voltage VsL3 serving as, for example, an electric state parameter correlating with the magnitude of the drain current or the flyback current for the third lower-arm switch SL3. The lower-arm controller 50 also obtains the terminal voltage Vds of each of the first to third lower-arm switches SL1 to SL3.

In the twelfth embodiment, one of the set of the first to third upper-arm switches SH1 to SH3 and the set of the first to third lower-arm switches SL1 to SL3, which is in the on state based on the charging task in response to the on command sent from the control apparatus 30, will be referred to as a set of first to third target arm switches.

Additionally, the other of the set of the first to third upper-arm switches SH1 to SH3 and the set of the first to third lower-arm switches SL1 to SL3, which is in the off state based on the discharging task in response to the off command sent from the control apparatus 30, will be referred to as a set of first to third opposite arm switches.

Moreover, one of the set of the first to third upper-arm diodes DH1 to DH3 and the set of the first to third lower-arm diodes DL1 to DL3, which is incorporated in the set of the respective first to third target arm switches, will be referred to as a set of first to third target arm diodes.

The other of the set of the first to third upper-arm diodes DH1 to DH3 and the set of the first to third lower-arm diodes DL1 to DL3, which is incorporated in the set of the respective first to third opposite arm switches, will be referred to as a set of first to third opposite arm diodes.

One of the upper- and lower arm controllers 40 and 50, which drives the first to third target arm switches, will be referred to as the target arm controller, and the other of the upper- and lower arm controllers 40 and 50, which drives the first to third opposite arm switches, will be referred to as an opposite arm controller.

One of the set of the first to third upper-arm sense voltages VsH1 to VsH3 and the set of the first to third lower-arm sense voltages VsL1 to VsL3, which is obtained by the target arm controller, will be referred to as a set of first to third target arm voltages Vsr1 to Vsr3.

The other of the pair of the first to third upper-arm sense voltages VsH1 to VsH3 and the set of the first to third lower-arm sense voltages VsL1 to VsL3, which is obtained by the opposite arm controller, will be referred to as a set of first to third opposite arm voltages Vos1 to Vos3.

The following describes a target-arm switch driving routine carried out by the target arm controller according to the twelfth embodiment.

The target-arm switch driving routine carried out by the target arm controller according to the twelfth embodiment is similar to the target-arm switch driving routine (see FIG. 15) according to the fifth embodiment by replacing (1) The first and second target arm switches with "the first to third target arm switches"

(2) The first and second opposite arm switches with "the first to third opposite arm switches"

(3) The first and second conditions with "the first to third conditions"

The third condition is that the third target arm voltage Vsr3 has exceeded the overcurrent threshold Vca The following describes an opposite-arm switch driving routine carried out by the opposite arm controller according to the twelfth embodiment with reference to FIG. 24. The opposite arm controller is configured to perform the opposite-arm switch driving routine every predetermined control period.

When starting the opposite-arm switch driving routine, the opposite arm controller deter mines whether the command determination flag Fos is set to 0 in step S90. Note that the command determination flag Fos is previously prepared in each of the controllers 40 and 50, and the command determination flag Fos being set to 1 represents that the on command for the first to third opposite arm switches has been input thereto from the target arm controller, and the command determination flag Fos being set to 0 represents that the on command for the first to third opposite arm switches is not input thereto from the target arm controller. The command determination flag Fos is set to an initial value of 0.

Upon determining that the command determination flag Fos is set to 0 (YES in step S90), the opposite arm controller determines whether the off command for the first to third opposite arm switches has been input thereto in step S91.

Upon determining that the off command for the first to third opposite arm switches is not input thereto (NO in step S91), the opposite arm controller determines that the on command has been input thereto, and performs the charging task for the first to third opposite arm switches to thereby turn on the corresponding one of the first to third opposite arm switches in step S92.

Otherwise, upon determining that the off command for the first to third opposite arm switches has been input thereto (YES in step S91), the opposite arm controller determines whether the on command for switching the first to third opposite arm switches from the off state to the on state has been input thereto from the target arm controller in step S93. Upon determining that the on command for switching the first to third opposite arm switches from the off state to the on state is not input thereto from the target arm controller (NO in step S93), the opposite arm controller performs the discharging task for the first to third opposite arm switches to thereby turn off the corresponding one of the first to third opposite arm switches in step S94.

Otherwise, upon determining that the on command for switching the first to third opposite arm switches from the off state to the on state has been input thereto from the target arm controller (YES in step S93), the opposite arm controller performs the charging task for the first to third opposite arm switches to thereby turn on the first to third opposite arm switches independently of the off command being input thereto in step S95.

Following the operation in step S95, the opposite arm controller sets the command determination flag Fos to 1 in step S96.

After completion of the operation in step S96 or after determination that the command determination flag Fos is set to 1 (NO in step S90), the opposite-arm switch drive routine proceeds to step S97. In step S97, the opposite arm controller obtains the first to third opposite arm voltages Vos1 to Vos3, and the first to third terminal voltages, i.e. the first to third drain-source voltages, Vds1 to Vds3 in step S97. Thereafter, the Following the operation in step S97, the opposite-arm switch driving routine proceeds to step S98.

In step S98, the opposite arm controller recognizes (1) First power consumption of the first opposite arm switch based on the first opposite arm voltage Vos1 and the first terminal voltage Vds1

(2) Second power consumption of the second opposite arm switch based on the second opposite arm voltage Vos2 and the second terminal voltage Vds2

(3) Third power consumption of the third opposite arm switch based on the third opposite arm voltage Vos3 and the third terminal voltage Vds3

In step S98, the opposite arm controller identifies a maximum power-consumption switch, a medium power-consumption switch, and a minimum power-consumption switch in accordance with comparison in magnitude among the first power consumption, the second power consumption, and the third power consumption.

In step S98, the opposite arm controller adjusts the gate voltages Vgs of the respective maximum power-consumption switch, middle power-consumption switch, and minimum power-consumption switch such that (1) The gate voltage, which will be referred to as Vgs (MAX), of the maximum power-consumption switch is lower than the gate voltage, which will be referred to as Vgs(MED), of the medium power-consumption switch (2) The gate voltage, which will be referred to as Vgs (MIN), of the medium power-consumption switch is lower than the gate voltage Vgs (MIN), which will be referred to as Vgs(MIN), of the minimum power-consumption switch (3) The gate voltage Vgs of each of the maximum power-consumption switch, middle power-consumption switch, and minimum power-consumption switch is maintained to be equal to or higher than the corresponding threshold voltage Vth The operations in steps S95 to S98 serve as, for example, the protective driver.

This configuration enables the quantities of heat generated by the respective first to third opposite arm switches to balance with each other, resulting in the temperatures of the first to third opposite arm switches balancing with each other in addition to the same benefits as those achieved by the fifth embodiment.

Modifications

The present disclosure is not limited to the above embodiments, and the above embodiments can be freely combined with each other or variably modified within the scope of the present disclosure.

Each of the upper- and lower-arm drive circuits DrCH and DrCL can be configured to determine whether another failure, such as an overvoltage failure or an overheating failure, has occurred in a corresponding one of upper- and lower-arm switches.

The overvoltage failure is that the terminal voltage, i.e. the drain-source voltage, Vds of a switch has exceeded a predetermined overvoltage threshold.

For example, each of the upper- and lower-arm drive circuits DrCH and DrCL can be configured to obtain the terminal voltage, i.e. the drain-source voltage, Vds of a corresponding one of upper- and lower-arm switches, and determine that an overvoltage failure has occurred in the corresponding one of upper- and lower-arm switches upon determining that the terminal voltage Vds is higher than the predetermined overvoltage threshold.

The overheating failure is that the temperature of a switch has exceeded the temperature threshold $T\alpha$.

As another example, each of the upper- and lower-arm drive circuits DrCH and DrCL can be configured to obtain a temperature of a corresponding one of upper- and lower-arm switches, and determine that an overheating failure has occurred in the corresponding one of upper- and lower-arm switches upon determining that the obtained temperature is higher than the temperature threshold $T\alpha$.

The configuration of the assembly of the drive circuits DrCH and DrcL according to each of the fifth to eleventh embodiments can be applied to an inverter comprised of three or more upper-arm switches and three or more lower-arm switches for each phase.

The configuration of the assembly of the drive circuits DrCH and DrcL according to the twelfth embodiment can be applied to an inverter comprised of four or more upper-arm switches and four or more lower-arm switches for each phase.

One of the upper- and lower-arms can be comprised of switches parallely connected to each other for each phase, and the other of the upper- and lower-arm can be comprised of a single switch.

In each of the first to twelfth embodiments, the upper-arm drive circuits DrCH are provided for the respective upper-arm switches, and the lower-arm drive circuits DrCL are provided for the respective lower-arm switches, but the present disclosure is not limited thereto. Specifically, a common upper-arm drive circuit can be provided for the upper-arm switches, and a common lower-arm drive circuit can be provided for the lower-arm switches. In addition, a common drive circuit can be provided for the upper-arm switches and the lower-arm switches.

In each of the first to twelfth embodiments, all the switches are each comprised of a MOSFET (see, for example, FIG. 13 or FIG. 23), but at least one of the switches can be comprised of an MOSFET, and the remaining switches can be each comprised of another type switch, such as an IGBT to which a free-wheeling or flyback diode connected in antiparallel.

Only one of the upper- and lower-arms of an inverter can be comprised of switches each incorporating an intrinsic diode. The assembly of the drive circuits DrCH and DrcL according to each of the first to twelfth embodiment is capable of reducing the amount of heat generated from a switch with an intrinsic diode when a flyback current flows toward the switch.

Figure 13:
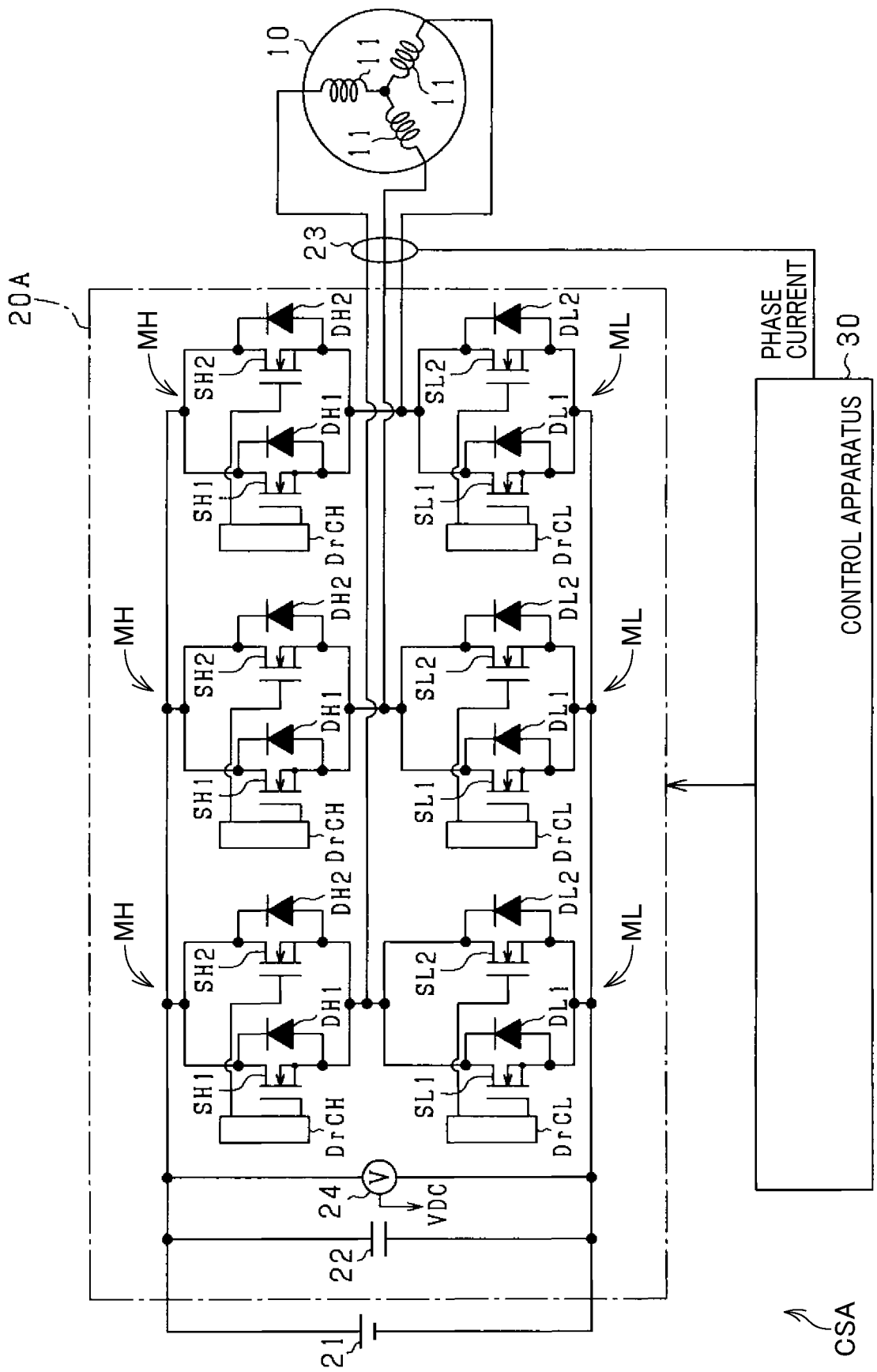
FIG. 13 is a circuit diagram schematically illustrating an example of the overall structure of a control system for a rotary electric machine according to the fifth embodiment of the present disclosure.

As each of the switches constituting the upper- and lower-arms of each of the inverters illustrated in FIGS. 1, 13, and 23, a switch incorporating an intrinsic diode, which is other than MOSFETS, can be used.

The present disclosure is not limited to a three-phase inverter, and can be applied to multiphase inverters, and can also be applied to power converters each including at least one of a voltage boosting function and a voltage reducing function.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A drive circuit for driving an upper-arm switch and a lower-arm switch connected in series to each other, the drive circuit comprising:
a main driver configured to alternately turn on the upper-arm switch and the lower-arm switch,
one of the upper-arm switch and the lower-arm switch being in an on state by the main driver being referred to as a target arm switch,
the other of the upper-arm switch and the lower-arm switch being in an off state by the main driver being referred to as an opposite arm switch,
an intrinsic diode connected in antiparallel to the opposite arm switch being referred to as an opposite arm diode; and
a protective driver configured to:
determine whether a failure has occurred in the target arm switch; and
change the target arm switch from the on state to the off state, and the opposite arm switch from the off state to the on state upon determining that a failure has occurred in the target arm switch.

2. The drive circuit according to claim 1, wherein:
the protective driver is configured to:
estimate a timing at which a flyback current starts to flow toward the opposite arm diode due to change of the target arm switch from the on state to the off state; and
change the opposite arm switch from the off state to the on state after the estimated timing.

3. The drive circuit according to claim 1, wherein:
each of the upper- and lower-arm switches has a control terminal; and
the protective driver is configured to:
determine whether a voltage at the control terminal of the target arm switch has lowered below a predetermined determination voltage; and
change the opposite arm switch from the off state to the on state upon determining that the voltage at the control terminal of the target arm switch has lowered below the predetermined determination voltage.

4. The drive circuit according to claim 1, wherein:
the protective driver is configured to:
determine whether a current flowing through the target arm switch has started to decrease; and
change the opposite arm switch from the off state to the on state upon determining that the current flowing through the target arm switch has started to decrease.

5. The drive circuit according to claim 1, wherein:
the protective driver is configured to:
determine whether a flyback current toward the opposite arm diode has started to flow upward; and
change the opposite arm switch from the off state to the on state upon determining that the flyback current toward the opposite arm diode has started to flow upward.

6. The drive circuit according to claim 1, wherein:
each of the upper- and lower-arm switches has a control terminal;
at least one of the upper-arm switch and the lower-arm switch is comprised of at least first and second switches connected in parallel with each other,
the target arm switch being included in the first and second switches; and
the protective driver is configured to:
determine whether a voltage at the control terminal of each of the first and second switches has lowered below a predetermined determination voltage; and
change the opposite arm switch from the off state to the on state upon determining that the voltage at the control terminal of each of the first and second switches has lowered below the predetermined determination voltage.

7. The drive circuit according to claim 1, wherein:
at least one of the upper-arm switch and the lower-arm switch is comprised of at least first and second switches connected in parallel with each other,
the target arm switch being included in the first and second switches; and
the protective driver is configured to:
determine whether the sum of currents flowing through the respective first and second switches has started to decrease; and
change the opposite arm switch from the off state to the on state upon determining that the sum of currents flowing through the respective first and second switches has started to decrease.

8. The drive circuit according to claim 1, wherein:
at least one of the upper-arm switch and the lower-arm switch is comprised of at least first and second switches connected in parallel with each other,
the target arm switch being included in the first and second switches; and
the protective driver is configured to:
determine whether a flyback current toward the opposite arm diode has started to flow upward; and
change the opposite arm switch from the off state to the on state upon determining that the flyback current toward the opposite arm diode has started to flow upward.

9. The drive circuit according to claim 1, wherein:
at least one of the upper-arm switch and the lower-arm switch is comprised of at least first and second switches connected in parallel with each other,
the target arm switch being included in the first and second switches; and
the protective driver is configured to:
determine whether a terminal voltage of each of the first and second switches has reached the input voltage; and
change the opposite arm switch from the off state to the on state upon determining that the terminal voltage of each of the first and second switches has reached the input voltage.

10. The drive circuit according to claim 1, wherein:
at least one of the upper-arm switch and the lower-arm switch is comprised of at least first and second switches connected in parallel with each other,
the target arm switch being included in the first and second switches; and
the protective driver is configured to:
determine whether a terminal voltage of the opposite arm switch has started to decrease; and
change the opposite arm switch from the off state to the on state upon determining that the terminal voltage of each of the first and second switches has started to decrease.

11. The drive circuit according to claim 1, wherein:
at least one of the upper-arm switch and the lower-arm switch is comprised of at least first and second switches connected in parallel with each other, each of the first and second switches being the opposite arm switch; and the protective driver is configured to:

change at least one of the first and second switches, each of which is the opposite arm switch, from the off state to the on state.

12. The drive circuit according to claim 11, wherein:

each of the upper- and lower-arm switches has a control terminal;

the protective driver is configured to:

change each of the first and second switches from the off state to the on state;

obtain a temperature of each of the first and second switches;

increase a voltage at the control terminal of one of the first and second switches, the temperature of one of the first and second switches being lower than the temperature of the other of the first and second switches; and decrease the voltage at the control terminal of the other of the first and second switches.

13. The drive circuit according to claim 11, wherein:

each of the upper- and lower-arm switches has a control terminal;

the protective driver is configured to:

change each of the first and second switches from the off state to the on state;

obtain a current flowing through each of the first and second switches;

increase a voltage at the control terminal of one of the first and second switches, a magnitude of the current flowing through one of the first and second switches being lower than the magnitude of the current flowing through the other of the first and second switches; and decrease the voltage at the control terminal of the other of the first and second switches.

14. The drive circuit according to claim 11, wherein:

each of the upper- and lower-arm switches has a control terminal;

at least one of the upper-arm switch and the lower-arm switch is comprised of first to third switches connected in parallel with each other, each of the first and second switches being the opposite arm switch; and the protective driver is configured to:

change each of the first to third switches from the off state to the on state;

obtain power consumptions of the respective first, second, and third switches;

increase a voltage at the control terminal of a selected one of the first to third switches, the power consumption of the selected one of the first to third switches being minimum in all the power consumptions of the first to third switches; and decrease the voltage at the control terminal of a selected one of the remaining switches, the power consumption of the selected one of the remaining switches being maximum in all the power consumptions of the first to third switches.

15. The drive circuit according to claim 11, wherein:

the protective driver is configured to:

obtain a temperature of each of the first and second switches;

determine whether the temperature of each of the first and second switches is equal to or lower than a threshold temperature; and change only one of the first and second switches from the off state to the on state upon determining that the temperature of the only one of the first and second switches is equal to or lower than the threshold temperature.

16. The drive circuit according to claim 1, wherein:

each of the upper- and lower-arm switches has a control terminal;

the main driver is configured to apply a first voltage to the control terminal of the opposite arm switch to thereby turn on the opposite arm switch; and the protective driver is configured to apply a second voltage to the control terminal of the opposite arm switch to thereby turn on the opposite arm switch, the second voltage being higher than the first voltage.

* * * * *